(12) United States Patent
Kim

(10) Patent No.: US 11,848,404 B2
(45) Date of Patent: *Dec. 19, 2023

(54) LIGHT EMITTING DEVICE AND LIGHT EMITTING MODULE INCLUDING THE SAME

(71) Applicant: SEOUL SEMICONDUCTOR CO., LTD., Ansan-si (KR)

(72) Inventor: Ji Ho Kim, Ansan-si (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/884,219

(22) Filed: Aug. 9, 2022

(65) Prior Publication Data

US 2022/0384691 A1    Dec. 1, 2022

Related U.S. Application Data

(63) Continuation of application No. 16/818,766, filed on Mar. 13, 2020, now Pat. No. 11,424,390, which is a
(Continued)

(30) Foreign Application Priority Data

Dec. 19, 2017  (KR) .................. 10-2017-0175450
Dec. 17, 2018  (KR) .................. 10-2018-0163551

(51) Int. Cl.
*H01L 33/48*    (2010.01)
*H01L 33/50*    (2010.01)
*H01L 23/00*    (2006.01)

(52) U.S. Cl.
CPC .......... *H01L 33/486* (2013.01); *H01L 33/502* (2013.01); *H01L 33/507* (2013.01); *H01L 24/13* (2013.01)

(58) Field of Classification Search
CPC ... H01L 33/486; H01L 33/502; H01L 33/507; H01L 24/13; H01L 24/27; H01L 24/29;
(Continued)

(56) References Cited

U.S. PATENT DOCUMENTS

2011/0127558 A1* 6/2011 Park .................. H01L 33/54
257/E33.056
2012/0319150 A1* 12/2012 Shimomura .......... H01L 24/97
257/E33.072
(Continued)

FOREIGN PATENT DOCUMENTS

CN      107316930 A    11/2017
JP      4675906        4/2011
(Continued)

OTHER PUBLICATIONS

Office Action issued in corresponding CN Application No. 201880005641.2, dated Oct. 11, 2021 (10 pages).
(Continued)

*Primary Examiner* — Jonathan Han
(74) *Attorney, Agent, or Firm* — Perkins Coie LLP

(57) ABSTRACT

A light emitting device includes a light emitting diode chip, a light transmitting member, a white barrier member, and a conductive adhesive member. The light emitting diode chip has a bump pad formed on the lower surface thereof. The light transmitting member covers the side surfaces and the upper surface of the light emitting diode chip, and the upper surface of the light transmitting member has a rectangular shape having long sides and short sides. The conductive adhesive member is formed to extend through the white barrier member from the bottom of the light emitting diode chip. The upper surface of the conductive adhesive member is connected to the bump pad of the light emitting diode chip, and the lower surface of the conductive adhesive
(Continued)

member is exposed at the lower surface of the white barrier member.

20 Claims, 21 Drawing Sheets

Related U.S. Application Data continuation of application No. PCT/KR2018/016127, filed on Dec. 18, 2018.

(58) Field of Classification Search
CPC . H01L 2224/04026; H01L 2224/05553; H01L 2224/06151; H01L 2224/2732; H01L 2224/27334; H01L 2224/29012; H01L 2224/29017; H01L 25/0753; H01L 33/58; H01L 25/167; H01L 33/505; H01L 2224/29007; H01L 2224/291; H01L 2224/95; H01L 33/60; H01L 33/62; H01L 33/56

See application file for complete search history.

(56) References Cited

U.S. PATENT DOCUMENTS

| | | | |
|---|---|---|---|
| 2015/0221835 A1* | 8/2015 | Tischler | H01L 25/165 438/27 |
| 2016/0079211 A1* | 3/2016 | Konishi | H01L 25/0753 438/27 |
| 2016/0087156 A1 | 3/2016 | Choi | |
| 2017/0358716 A1 | 12/2017 | Park et al. | |
| 2018/0047712 A1* | 2/2018 | Bang | G02B 6/0051 |
| 2019/0333896 A1* | 10/2019 | Song | H01L 25/075 |
| 2020/0212264 A1 | 7/2020 | Kim | |

FOREIGN PATENT DOCUMENTS

| | | |
|---|---|---|
| KR | 101158242 | 6/2012 |
| KR | 1020150107400 | 9/2015 |

OTHER PUBLICATIONS

International Search Report for International Application PCT/KR2018/016127, dated Apr. 17, 2019.

* cited by examiner

LIGHT EMITTING DEVICE AND LIGHT EMITTING MODULE INCLUDING THE SAME

CROSS-REFERENCE OF RELATED APPLICATIONS

This application is a continuation of U.S. patent application Ser. No. 16/818,766, filed on Mar. 13, 2020, which is a continuation of PCT Application No. PCT/KR2018/016127, filed on Dec. 18, 2018, which claims priority under 35 U.S.C. § 119 of Korean Patent Application No. 10-2017-0175450, filed on Dec. 19, 2017, and Korean Patent Application No. 10-2018-0163551, filed on Dec. 17, 2018. All the aforementioned applications are hereby incorporated by reference in their entireties.

TECHNICAL FIELD

Embodiments of the present disclosure relate to a light emitting device and a light emitting module including the same.

BACKGROUND

In general, a light emitting device is used as a light source in various fields including a light source for backlight modules in a display device. In particular, light emitting devices used as the light source for backlight modules can be classified into top type light emitting devices and side-view type light emitting devices. The side-view type light emitting device is used in an edge type backlight module to emit light to a side surface of a light guide plate.

The light emitting device used in the edge type backlight module is generally required to emit light narrowly in a thickness direction of the light guide plate, that is, in a vertical direction thereof, while emitting light broadly along an edge of the light guide plate. To this end, the side-view type light emitting device used in the edge type backlight module generally has an elongated shape in one direction thereof.

In recent years, various studies have been made to develop an edge type backlight module by directly mounting chip-scale package type light emitting devices on a circuit board to be used as light sources. A chip-scale package can further reduce the size of the light emitting device and provides more convenience in manufacturing of a backlight module than a side-view light emitting diode package using a typical lead frame.

In using the chip-scale package type light emitting device as a side-view type light emitting device, a light emitting diode chip mounted on the side-view type light emitting device is configured to have an elongated shape in one direction thereof.

SUMMARY

Embodiments of the present disclosure provide a light emitting device adapted to prevent generation of dark spots and a light emitting module including the same.

Embodiments of the present disclosure provide a light emitting device capable of improving luminous efficacy while maintaining a small size, and a light emitting module including the same.

In accordance with one embodiment of the present disclosure, a light emitting device includes a light emitting diode chip, a light transmitting member, a white barrier member, and an electrically conductive bonding member. The light emitting diode chip includes bump pads formed on a lower surface thereof. The light transmitting member covers upper and side surfaces of the light emitting diode chip, and the upper surface of the light emitting diode chip has a rectangular shape having long sides and short sides. The white barrier member covers opposite long side surfaces of the light transmitting member and a lower surface of the light emitting diode chip. The electrically conductive bonding member is disposed under the light emitting diode chip and penetrating the white barrier member. Here, the electrically conductive bonding member has an upper surface connected to the bump pads of the light emitting diode chip and a lower surface exposed to a lower surface of the white barrier member. In addition, the white barrier member exposes opposite short side surfaces of the light transmitting member.

In accordance with another embodiment of the present disclosure, a light emitting module includes a circuit board and a plurality of light emitting devices mounted on the circuit board and each having an upper surface having long sides and short sides. Each of the light emitting devices includes a light emitting diode chip, a light transmitting member, a white barrier member, and an electrically conductive bonding member. The light emitting diode chip includes bump pads formed on a lower surface thereof. The light transmitting member covers upper and side surfaces of the light emitting diode chip. An upper surface of the light transmitting member has a rectangular shape having long sides and short sides. The white barrier member covers opposite long side surfaces and a lower surface of the light transmitting member and a lower surface of the light emitting diode chip. The electrically conductive bonding member is disposed under the light emitting diode chip and penetrating the white barrier member. Here, the electrically conductive bonding member has an upper surface connected to the bump pads of the light emitting diode chip and a lower surface exposed to a lower surface of the white barrier member. In addition, the white barrier member exposes opposite side surfaces of the light transmitting member. Further, the plural light emitting devices are arranged such that adjacent light emitting devices face exposed surfaces of the light transmitting member.

Embodiments of the present disclosure provide a light emitting device, in which a separation distance between light emitting diode chips in adjacent light emitting devices is reduced to allow a sufficient quantity of light to reach a region between the light emitting devices, and a light emitting module including the same.

Embodiments of the present disclosure provide a light emitting device capable of improving luminous efficacy while maintaining a small size, and a light emitting module including the same.

The above and other features and advantages of the present disclosure will become apparent from the following description.

BRIEF DESCRIPTION OF DRAWINGS

FIG. 7 is a plan view of the light emitting device 400 according to the second embodiment.

FIG. 8 is a side-sectional view (D1-D2) of the light emitting device shown in FIG. 7.

FIG. 9 is another side-sectional view (D3-D4) of the light emitting device shown in FIG. 7.

FIG. 10 is a plan view of the light emitting device 500 according to the third embodiment.

FIG. 11 is a side-sectional view (E1-E2) of the light emitting device shown in FIG. 10.

FIG. 12 is a side-sectional view (E3-E4) of the light emitting device shown in FIG. 10.

FIG. 15 is a plan view of the light emitting device 1100 according to the fourth embodiment.

FIG. 16 and FIG. 17 are cross-sectional views (F1-F2, F3-F4) of the light emitting device 1100 according to the third embodiment.

FIG. 18 is a bottom view of the light emitting device 1100 according to the fourth embodiment.

FIG. 19 illustrates that a first bonding film 20 is stacked on a support substrate 10.

FIG. 20 illustrates that a first light transmitting member 1121 is formed on the first bonding film 20.

FIG. 21 illustrates that a plurality of light emitting diode chips 1110 is disposed on the first light transmitting member 1121.

FIG. 22 illustrates that an electrically conductive bonding member 1140 is formed on the first bump pad 1115 and the second bump pad 1116 of the light emitting diode chip 1110.

FIG. 23 illustrates that a second light transmitting member 1122 is formed.

FIG. 24 illustrates patterning a light transmitting member 1123.

FIG. 25 illustrates that a white barrier member 1130 is formed on the first bonding film 20.

FIG. 26 illustrates polishing an upper surface of the white barrier member 1130.

FIG. 27 illustrates a dicing process that cuts the white barrier member 1130 between adjacent light emitting diode chips 1110.

FIG. 28 illustrates that the individually divided light emitting devices 1100 are separated from the first bonding film 20.

FIG. 29 illustrates that the light emitting devices 1100 separated from each other are disposed on a second bonding film 30.

FIG. 30 illustrates polishing the light emitting devices 1110 to have flat upper surfaces.

FIG. 31 is a plan view of the light emitting device 1200 according to the fifth embodiment.

FIG. 32 and FIG. 33 are cross-sectional views of the light emitting device 1200 according to the fifth embodiment.

DETAILED DESCRIPTION OF THE EMBODIMENTS

Figure 1:
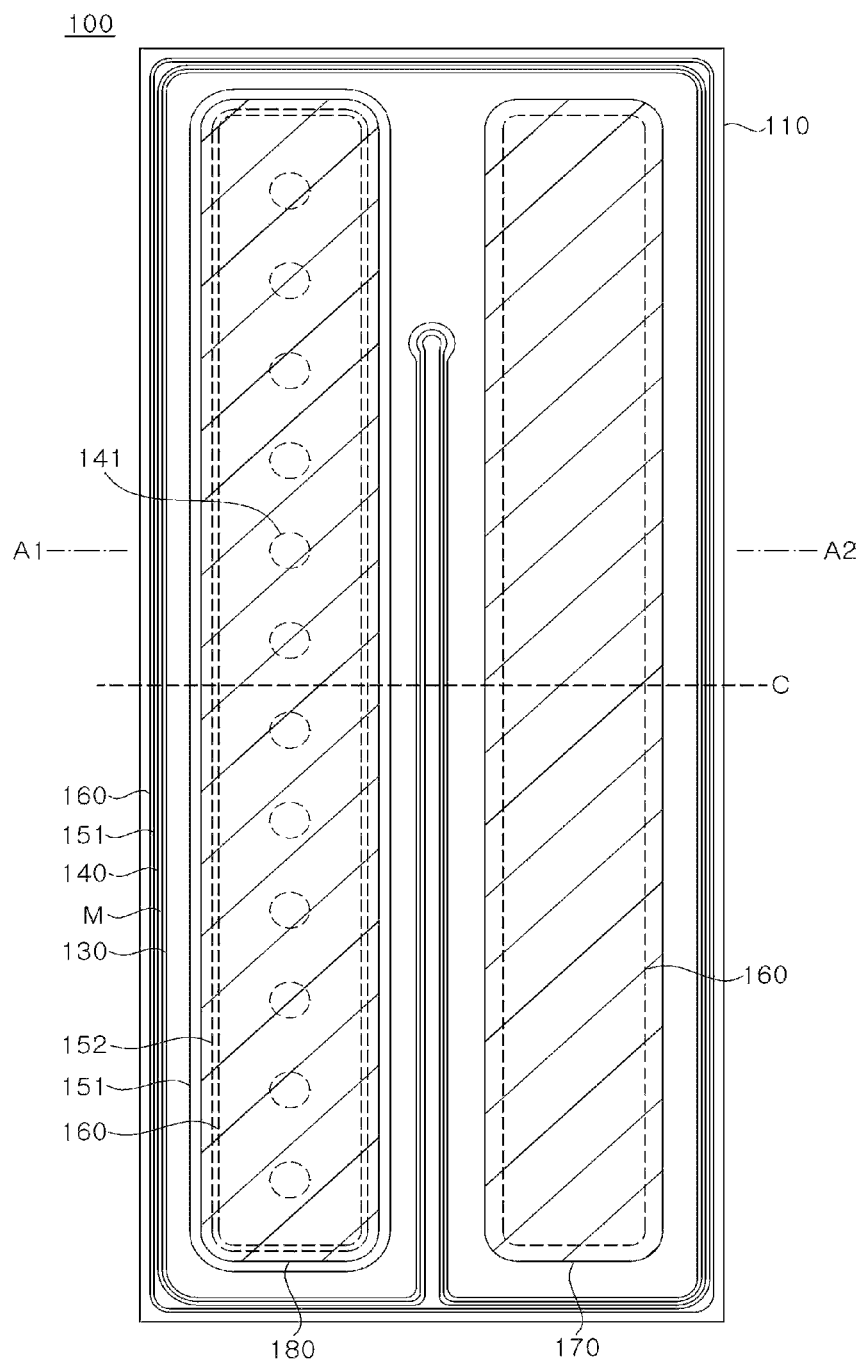
FIG. 1 is a bottom view of the light emitting diode chip 100 according to a first embodiment of the present disclosure.

Hereinafter, embodiments of the present disclosure will be described in detail with reference to the accompanying drawings. The following embodiments are provided by way of example so as to fully convey the spirit of the present disclosure to those skilled in the art. Accordingly, the present disclosure is not limited to the embodiments disclosed herein and can also be implemented in different forms. In the drawings, widths, lengths, thicknesses, and the like of elements or components can be exaggerated for clarity and descriptive purposes. Throughout the specification, like reference numerals denote like elements having the same or similar functions.

Herein, the term "light emitting diode chip" refers to a chip individually separated by an isolation process after growth of epitaxial layers and formation of electrodes and bump pads using a wafer. The term "light emitting device" means a unit element individually mounted on a circuit board. The light emitting device includes a light emitting diode chip individually separated by the isolation process.

In accordance with one embodiment of the present disclosure, a light emitting device includes a substrate, a light emitting structure disposed on a lower surface of the substrate, a first bump pad disposed on a lower surface of the light emitting structure and electrically connected to the first conductivity type semiconductor layer, and a second bump pad disposed on the lower surface of the light emitting structure to be spaced apart from the first bump pad and electrically connected to the second conductivity type semiconductor layer. The light emitting structure includes a first conductivity type semiconductor layer, a second conductivity type semiconductor layer, and an active layer interposed between the first conductivity type semiconductor layer and the second conductivity type semiconductor layer disposed on the lower surface of the substrate. The lower surface of the substrate has a rectangular shape having long sides and short sides. The first bump pad is disposed in an elongated shape along one long side of the substrate. In addition, the second bump pad is disposed in an elongated shape along the other long side of the substrate.

At least one of the first bump pad and the second bump pad may intersect with a central line parallel to the short side of the lower surface of the substrate. The first bump pad may include a first length portion disposed in an elongated shape along one long side of the substrate and a first extending portion extending from the first length portion to be disposed along one short side of the substrate. The second bump pad may include a second length portion disposed in an elongated shape along the other long side of the substrate and a second extending portion extending from the second length portion to be disposed along the other short side of the substrate.

The light emitting device may further include a wavelength conversion member covering upper and side surfaces of the substrate. A thickness of the wavelength conversion member on the side surface of the substrate may be smaller than a height from the upper surface of the substrate to the first bump pad and the second bump pad and may be greater than a thickness of the wavelength conversion member on the upper surface of the substrate.

The light emitting device may further include a white barrier member covering side surfaces of the wavelength conversion member and the lower surface of the light emitting structure. The white barrier member covers the side surface of the wavelength conversion member along the opposite long sides of the substrate such that the side surfaces of the wavelength conversion member covering the opposite short sides of the substrate are exposed. The white barrier member may include a silicone resin or an epoxy resin. An inner wall of the white barrier member covering the side surfaces of the wavelength conversion member may have an inclination.

The light emitting device may further include electrically conductive bonding members connected to the first bump pad and the second bump pad. The white barrier member covering the lower surface of the light emitting structure may include a plurality of through-holes filled with the electrically conductive bonding members.

In accordance with another embodiment of the present disclosure, a light emitting module includes a circuit board and a light emitting device mounted on the circuit board. The light emitting device includes a substrate, a light emitting structure disposed on a lower surface of the substrate, a first bump pad disposed on a lower surface of the light emitting structure and electrically connected to the first conductivity type semiconductor layer, and a second bump pad disposed on the lower surface of the light emitting structure to be spaced apart from the first bump pad and electrically connected to the second conductivity type semiconductor layer. The light emitting structure includes a first conductivity type semiconductor layer, a second conductivity type semiconductor layer, and an active layer interposed between the first conductivity type semiconductor layer and the second conductivity type semiconductor layer disposed on the lower surface of the substrate. The lower surface of the substrate has a rectangular shape having long sides and short sides. The first bump pad is disposed in an elongated shape along one long side of the substrate. In addition, the second bump pad is disposed in an elongated shape along the other long side of the substrate.

At least one of the first bump pad and the second bump pad may intersect with a central line parallel to the short side of the lower surface of the substrate. The first bump pad may include: a first length portion disposed in an elongated shape along one long side of the substrate; and a first extending portion extending from the first length portion to be disposed along one short side of the substrate. The second bump pad may include: a second length portion disposed in an elongated shape along the other long side of the substrate; and a second extending portion extending from the second length portion to be disposed along the other short side of the substrate.

The light emitting module may further include a wavelength conversion member covering upper and side surfaces of the substrate. The light emitting module may further include a white barrier member covering side surfaces of the wavelength conversion member and the lower surface of the light emitting structure. The white barrier member covers the side surface of the wavelength conversion member along the opposite long sides of the substrate such that the side surfaces of the wavelength conversion member covering the opposite short sides of the substrate are exposed. The light emitting module may further include electrically conductive bonding members connected to the first bump pad and the second bump pad. The white barrier member covering the lower surface of the light emitting structure may include a plurality of through-holes filled with the electrically conductive bonding members.

The circuit board of the light emitting module may include a first region in which the light emitting device is disposed and a second region perpendicular to the first region.

The light emitting module may further include a Zener device mounted on the circuit board to be placed at one short side of the substrate of the light emitting device and including a Zener diode. The Zener device may further include a white barrier member covering the Zener diode.

In accordance with a further another embodiment of the present disclosure, a light emitting device includes a light emitting diode chip, a light transmitting member, a white barrier member, and an electrically conductive bonding member. The light emitting diode chip includes bump pads formed on a lower surface thereof. The light transmitting member covers upper and side surfaces of the light emitting diode chip, and the upper surface of the light emitting diode chip has a rectangular shape having long sides and short sides. The white barrier member covers opposite long side surfaces of the light transmitting member and a lower surface of the light emitting diode chip. The electrically conductive bonding member is disposed under the light emitting diode chip and penetrating the white barrier member. Here, the electrically conductive bonding member has an upper surface connected to the bump pads of the light emitting diode chip and a lower surface exposed to a lower surface of the white barrier member. In addition, the white barrier member exposes opposite short side surfaces of the light transmitting member.

The light emitting diode chip includes a substrate, a light emitting structure, a first bump pad, and a second bump pad. The light emitting structure is disposed on a lower surface of the substrate and includes a first conductivity type semiconductor layer, a second conductivity type semiconductor layer, and an active layer interposed between the first conductivity type semiconductor layer and the second conductivity type semiconductor layer. The first bump pad is disposed on a lower surface of the light emitting structure and is electrically connected to the first conductivity type semiconductor layer. The second bump pad is disposed on the lower surface of the light emitting structure to be spaced apart from the first bump pad and is electrically connected to the second conductivity type semiconductor layer. Here, the lower surface of the substrate has a rectangular shape having long sides and short sides. In addition, the first bump pad and the second bump pad are disposed parallel to each other along long sides of the lower surface of the substrate.

A portion of the wavelength conversion member covering a short side surface of the light emitting diode chip may have a smaller thickness than a portion of the wavelength conversion member covering a long side surface of the light emitting diode chip.

In one embodiment, an inner wall of the white barrier member covering the side surface of the wavelength conversion member may have an inclination. The inner wall of the white barrier member may include a first inner wall adjoining a bottom surface of the white barrier member and a second inner wall adjoining the first inner wall and extending to an upper surface of the white barrier member. Here, the first inner wall and the second inner wall may have different inclinations. The first inner wall of the white barrier member may have a larger inclination than the second inner wall thereof with reference to a side surface of the light emitting diode chip.

The light emitting device may further include wavelength conversion materials dispersed in the light transmitting member.

In accordance with yet another embodiment of the present disclosure, there is provided a light emitting module including a circuit board and a plurality of light emitting devices mounted on the circuit board and each having an upper surface having long sides and short sides. The light emitting device includes a light emitting diode chip, a light transmitting member, a white barrier member, and an electrically conductive bonding member. The light emitting diode chip includes bump pads formed on a lower surface thereof. The light transmitting member covers upper and side surfaces of the light emitting diode chip. An upper surface of the light transmitting member has a rectangular shape having long sides and short sides. The white barrier member covers opposite long side surfaces and a lower surface of the light transmitting member and a lower surface of the light emitting diode chip. The electrically conductive bonding member is disposed under the light emitting diode chip and penetrating the white barrier member. Here, the electrically conductive bonding member has an upper surface connected to the bump pads of the light emitting diode chip and a lower surface exposed to a lower surface of the white barrier member. In addition, the white barrier member exposes opposite side surfaces of the light transmitting member. Further, the plural light emitting devices are arranged such that side surfaces of adjacent light emitting devices having the light transmitting member exposed thereon face each other.

The light emitting diode chip includes a substrate, a light emitting structure, a first bump pad, and a second bump pad. The light emitting structure is disposed on a lower surface of the substrate and includes a first conductivity type semiconductor layer, a second conductivity type semiconductor layer, and an active layer interposed between the first conductivity type semiconductor layer and the second conductivity type semiconductor layer. The first bump pad is disposed on a lower surface of the light emitting structure and is electrically connected to the first conductivity type semiconductor layer. The second bump pad is disposed on the lower surface of the light emitting structure to be spaced apart from the first bump pad and is electrically connected to the second conductivity type semiconductor layer. Here, the lower surface of the substrate has a rectangular shape having long sides and short sides. In addition, the first bump pad and the second bump pad are disposed parallel to each other along long sides of the lower surface of the substrate.

A portion of the wavelength conversion member covering a short side surface of the light emitting diode chip may have a smaller thickness than a portion of the wavelength conversion member covering a long side surface of the light emitting diode chip.

In one embodiment, an inner wall of the white barrier member covering the side surface of the wavelength conversion member may have an inclination. The inner wall of the white barrier member may include a first inner wall adjoining a bottom surface of the white barrier member and a second inner wall adjoining the first inner wall and extending to an upper surface of the white barrier member. Here, the first inner wall and the second inner wall may have different inclinations.

The first inner wall of the white barrier member may have a larger inclination than the second inner wall thereof with reference to a side surface of the light emitting diode chip. A portion of the light transmitting member covering the opposite short side surfaces of the light emitting device may be exposed by the white barrier member. The circuit board may be formed with an electrically conductive circuit pattern. The plural light emitting devices may be electrically connected to the circuit pattern.

The plural light emitting devices may be connected in series to each other by the circuit pattern. The light emitting device may further include a wavelength conversion material dispersed in the light transmitting member.

Hereinafter, embodiments of the present disclosure will be described in detail with reference to the accompanying drawings.

Figure 2:
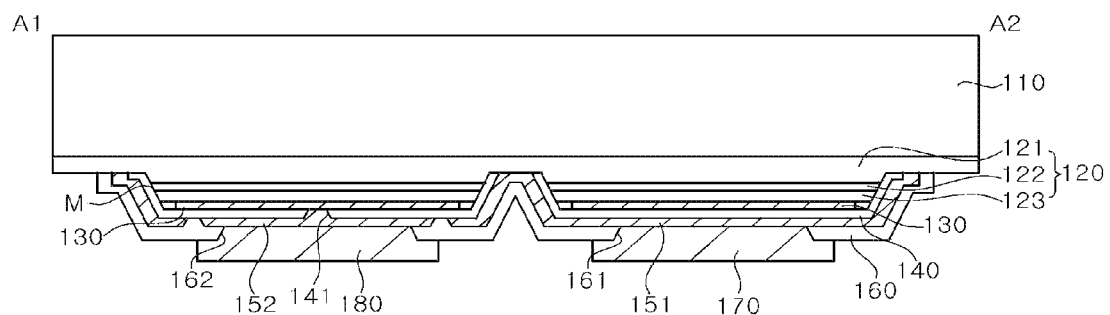
FIG. 2 is a cross-sectional view (A1-A2) of the light emitting diode chip 100 according to the first embodiment.

FIG. 1 and FIG. 2 are views of alight emitting diode chip according to a first embodiment of the present disclosure. FIG. 1 is a bottom view of the light emitting diode chip 100 according to the first embodiment and FIG. 2 is a cross-sectional view (A1-A2) of the light emitting diode chip 100 according to the first embodiment.

Referring to FIG. 1 and FIG. 2, the light emitting diode chip 100 includes a substrate 110, a light emitting structure 120, an ohmic reflective layer 130, a first insulation layer 140, the first pad metal layer 151, a second pad metal layer 152, a second insulation layer 160, a first bump pad 170, and a second bump pad 180. With these components, the light emitting diode chip 100 has a rectangular structure wherein a lower periphery of the light emitting diode chip 100 has long sides and short sides. Herein, the long sides refer to sides of the lower periphery having a longer length than the short sides of the lower periphery.

The substrate 110 may be selected from any structures allowing growth of a gallium nitride semiconductor layer thereon without limitation. For example, the substrate 110 may include a sapphire substrate, a gallium nitride substrate, a SiC substrate, and the like, and may be a patterned sapphire substrate. The substrate 110 has a rectangular shape having long sides and short sides.

The light emitting structure 120 is formed on a lower surface of the substrate 110. The light emitting structure 120 includes a first conductivity type semiconductor layer 121, an active layer 122, and a second conductivity type semiconductor layer 123.

The first conductivity type semiconductor layer 121 is formed on the lower surface of the substrate 110. The first conductivity type semiconductor layer 121 may be a semiconductor layer grown on the substrate 110 and may be a gallium nitride semiconductor layer. The first conductivity type semiconductor layer 121 may be a gallium nitride semiconductor layer doped with n-type dopants, for example, Si. Here, although the first conductivity type semiconductor layer 121 is illustrated as being distinguished from the substrate 110, a border between the first conductivity type semiconductor layer 121 and the substrate 110 can be unclear when the substrate is a gallium nitride semiconductor layer.

A mesa M is disposed on a lower surface of the first conductivity type semiconductor layer 121. The mesa M may be placed in a region of the first conductivity type semiconductor layer 121. Accordingly, edge regions of the first conductivity type semiconductor layer may be exposed to the outside instead of being covered by the mesa M. In addition, the mesa M may include a portion of the first conductivity type semiconductor layer 121.

The mesa M includes the second conductivity type semiconductor layer 123 and the active layer 122. The active layer 122 is formed on the lower surface of the first conductivity type semiconductor layer 121 and the second conductivity type semiconductor layer 123 is formed on the lower surface of the active layer 122. The active layer 122 may have a single quantum well structure or a multi-quantum well structure. The composition and thickness of well layers in the active layer 122 determine the wavelengths of light. In particular, the active layer may be formed to generate UV light, blue light or green light through adjustment of the composition of the well layers.

The second conductivity type semiconductor layer 123 may be a gallium nitride semiconductor layer doped with p-type dopants, for example, Mg.

Each of the first conductivity type semiconductor layer 121 and the second conductivity type semiconductor layer 123 may be composed of a single layer, without being limited thereto. Each of the first conductivity type semiconductor layer 121 and the second conductivity type semiconductor layer 123 may be composed of multiple layers and may include a super-lattice layer.

The first conductivity type semiconductor layer 121, the active layer 122 and the second conductivity type semiconductor layer 123 may be grown on the substrate 110 in a chamber by a method well-known in the art, such as metal organic chemical vapor deposition (MOCVD) or molecular-beam epitaxy (MBE).

The mesa M has a slanted side surface to have an area gradually decreasing with increasing distance from the first conductivity type semiconductor layer 121. With this structure, layers covering the side surface of the mesa M can be stably formed.

The mesa M may have an elongated rectangular shape along the shape of the substrate 110 and may include a groove formed in a longitudinal direction of the substrate 110 to expose the first conductivity type semiconductor layer 121. As shown in FIG. 1, the groove may extend from a center of one short side of the mesa M adjacent to one short side of the substrate to pass the center of the mesa M along a long side of the substrate 110. The groove has a shorter length than the length of a long side of the mesa M. Thus, the other side of the mesa M having a short length is separated from the groove.

The ohmic reflective layer 130 is formed on a lower surface of the second conductivity type semiconductor layer 123 to contact the second conductivity type semiconductor layer 123. The ohmic reflective layer 130 may be disposed over substantially the entire region of the mesa in an upper region of the mesa M. Referring to FIG. 2, the ohmic reflective layer 130 is not disposed to cover the entirety of the upper region of the mesa M. For example, the ohmic reflective layer 130 may cover 80% or more of the upper region of the mesa M. Furthermore, the ohmic reflective layer 130 may cover 90% or more of the upper region of the mesa M. Although not shown in this drawing, the light emitting structure may further include an ohmic oxide layer (not shown) disposed in the upper region of the mesa M and covering the mesa M around the ohmic reflective layer 130. With the structure wherein the ohmic oxide layer (not shown) is disposed around the ohmic reflective layer 130, the light emitting structure has an enlarged ohmic contact region, thereby enabling reduction in forward voltage of a light emitting diode.

The ohmic reflective layer 130 may include a reflective metal layer. Accordingly, the ohmic reflective layer 130 reflects light generated from the active layer 122 and reaching the ohmic reflective layer 130 toward the substrate 110. For example, the ohmic reflective layer 130 may be composed of a single metal layer or may include an ohmic layer and a reflective layer. For example, the ohmic layer may be composed of a metal, such as Ni, and the reflective layer may be composed of a highly reflective metal, such as Ag or Al. In addition, the ohmic reflective layer 130 may include a barrier member. The barrier member may be composed of Ni, Ti, and Au. For example, the ohmic reflective layer may have a stack structure of Ni/Ag/Ni/Ti/Ni/Ti/Au/Ti.

According to another embodiment, the ohmic reflective layer 130 may include a transparent oxide layer forming ohmic contact with the second conductivity type semiconductor layer 123, an insulation layer covering the transparent oxide layer and having an opening exposing the transparent oxide layer, and a metal reflective layer covering the insulation layer and connected to the transparent oxide layer through the opening of the insulation layer. With this structure, the ohmic reflective layer can provide an omnidirectional reflector.

The first insulation layer 140 covers the mesa M and the ohmic reflective layer 130. In addition, the first insulation layer 140 may cover the side surface of the mesa M. Here, the first insulation layer 140 may cover a portion of the first conductivity type semiconductor layer 121 exposed through the side surface of the mesa M. With this structure, the first insulation layer 140 exposes the first conductivity type semiconductor layer 121 disposed along the periphery of the mesa M.

Further, the first insulation layer 140 is formed with at least one opening 141 that exposes the ohmic reflective layer 130. The opening 141 of the first insulation layer 140 is disposed on the lower surface of the mesa M on which the second pad metal layer 152 will be formed later. The second pad metal layer 152 is electrically connected to the second conductivity type semiconductor layer 123 through the opening 141.

The first insulation layer 140 may be composed of a single layer of $SiO_2$ or $Si_3N_4$. However, it should be understood that the first insulation layer 140 is not limited thereto. For example, the first insulation layer 140 may have a multilayer structure including a silicon nitride layer and a silicon oxide layer, and may include a distributed Bragg reflector in which silicon oxide layers and titanium oxide layers are alternately stacked one above another.

The first pad metal layer 151 is formed on a lower surface of the first insulation layer 140 and a lower surface of a portion of the first conductivity type semiconductor layer 121 exposed through the first insulation layer 140. The first pad metal layer 151 is insulated from the mesa M and the ohmic reflective layer 130 by the first insulation layer 140. With this structure, the first pad metal layer 151 contacts the first conductivity type semiconductor layer 121 and is electrically connected thereto.

The second pad metal layer 152 is formed on the lower surface of the first insulation layer 140 having the opening 141 therein and in the opening 141 to be spaced apart from the first pad metal layer 151. With this structure, the second pad metal layer 152 is electrically connected to the ohmic reflective layer 130 through the opening 141.

The first pad metal layer 151 and the second pad metal layer 152 may be formed of the same material by the same process. For example, the first pad metal layer 151 and the second pad metal layer 152 may have a stack structure of Cr/Al/Ni/Ti/Ni/Ti/Au/Ti.

The second insulation layer 160 is formed to cover the first pad metal layer 151 and the second pad metal layer 152. The second insulation layer 160 may cover the first conductivity type semiconductor layer 121 exposed along the periphery of the mesa M. Here, the second insulation layer 160 may expose the first conductivity type semiconductor layer 121 disposed at an edge of the substrate 110.

The second insulation layer 160 includes a first opening 161 exposing the first pad metal layer 151 and a second opening 162 exposing the second pad metal layer 152. The first opening 161 and the second opening 162 may be disposed in regions on the lower surface of the mesa M.

Referring to FIG. 1, the first opening 161 and the second opening 162 of the second insulation layer 160 are spaced apart from each other and are formed in an elongated shape along the long side of the substrate 110. Further, at least one of the first opening 161 and the second opening 162 may be formed to intersect with a central line C. Here, the central line C refers to a line parallel to the short side of the lower surface of the light emitting diode chip 100 or the substrate 110 and passing the center of the lower surface. That is, the central line C is a line extending from the center between opposite short sides of the light emitting diode chip to a long side thereof. Referring to FIG. 1, both the first opening 161 and the second opening 162 are formed to intersect with the central line C.

The second insulation layer 160 may be formed of a single layer of $SiO_2$ or $Si_3N_4$, without being limited thereto. For example, the second insulation layer 160 may have a multilayer structure including a silicon nitride layer and a silicon oxide layer, and may include a distributed Bragg reflector in which silicon oxide layers and titanium oxide layers are alternately stacked one above another.

The first bump pad 170 and the second bump pad 180 are formed on the first pad metal layer 151 and the second pad metal layer 152, respectively, and protrude downwards below the second insulation layer 160.

The first bump pad 170 is formed on a lower surface of the first pad metal layer 151 exposed through the first opening 161 of the second insulation layer 160. In addition, a lower surface of the first bump pad 170 may have a larger width than an upper surface thereof so as to cover a portion of the lower surface of the second insulation layer 160. With this structure, the first bump pad 170 is electrically connected to the first conductivity type semiconductor layer 121 through the first pad metal layer 151.

The second bump pad 180 is formed on a lower surface of the second pad metal layer 152 exposed through the second opening 162 of the second insulation layer 160. In addition, a lower surface of the second bump pad 180 may have a larger width than an upper surface thereof so as to cover a portion of the lower surface of the second insulation layer 160. With this structure, the second bump pad 180 is electrically connected to the second conductivity type semiconductor layer 123 through the second pad metal layer 152 and the ohmic reflective layer 130. The second pad metal layer 152 may be omitted. Here, the second bump pad 180 may directly contact the ohmic reflective layer 130.

With this structure, the lower surface of each of the first bump pad 170 and the second bump pad 180 covers the lower surface of the second insulation layer 160, thereby providing a large bonding area for bonding to external components. Accordingly, it is possible to achieve reliable connection between the light emitting diode chip 100 and the external components.

According to this embodiment, the light emitting diode chip 100 includes the first bump pad 170 and the second bump pad 180 covering the lower surface of the second insulation layer 160. However, it should be understood that the structure of the light emitting diode chip 100 is not limited thereto. For example, the first bump pad 170 may be restrictively placed on the first pad metal layer 151 exposed through the first opening 161 of the second insulation layer 160. In addition, the second bump pad 180 may be restrictively placed on the second pad metal layer 152 exposed through the second opening 162 of the second insulation layer 160.

The first bump pad 170 and the second bump pad 180 are formed along the first opening 161 and the second opening 162 of the second insulation layer 160. Accordingly, the first bump pad 170 is disposed in an elongated shape along one long side of the light emitting diode chip 100. Further, the second bump pad 180 is disposed in an elongated shape along the other long side of the light emitting diode chip 100. That is, the first bump pad 170 and the second bump pad 180 are spaced apart from each other in the lateral direction to be disposed in an elongated shape along both long sides of the light emitting diode chip 100. Referring to FIG. 1, both the first bump pad 170 and the second bump pad 180 have a length to intersect with the central line C.

The first bump pad 170 and the second bump pad 180 are formed of an electrically conductive material. For example, the first bump pad 170 and the second bump pad 180 may be composed of a single metal layer including Au or TiN, or may be composed of multiple layers including an Au layer and a TiN layer. However, it should be understood that the first bump pad 170 and the second bump pad 180 are not limited thereto and may be formed of any electrically conductive material.

Conventionally, a light emitting diode chip having a rectangular periphery is formed with two bump pads at opposite sides with respect to the central line thereof. With this structure, the light emitting diode chip has a higher metal density at the opposite sides thereof than a central region thereof. Thus, the light emitting diode chip having an elongated shape has a problem of easy bending or breakage around the central line.

However, the light emitting diode chip 100 according to this embodiment includes the first bump pad 170 and the second bump pad 180 formed to intersect with the central line and thus does not suffer from such a problem of bending or breakage around the central line.

Although both the first bump pad 170 and the second bump pad 180 according to this embodiment are formed to intersect with the central line C, it should be understood that other implementations are possible. That is, in the light emitting diode chip 100, at least one of the first bump pad 170 and the second bump pad 180 is formed to intersect with the central line C. Since metals are distributed around the central line C even in this structure, the strength around the central line C of the light emitting diode chip increases, thereby preventing the light emitting diode chip 100 from being bent or broken.

Figure 3:
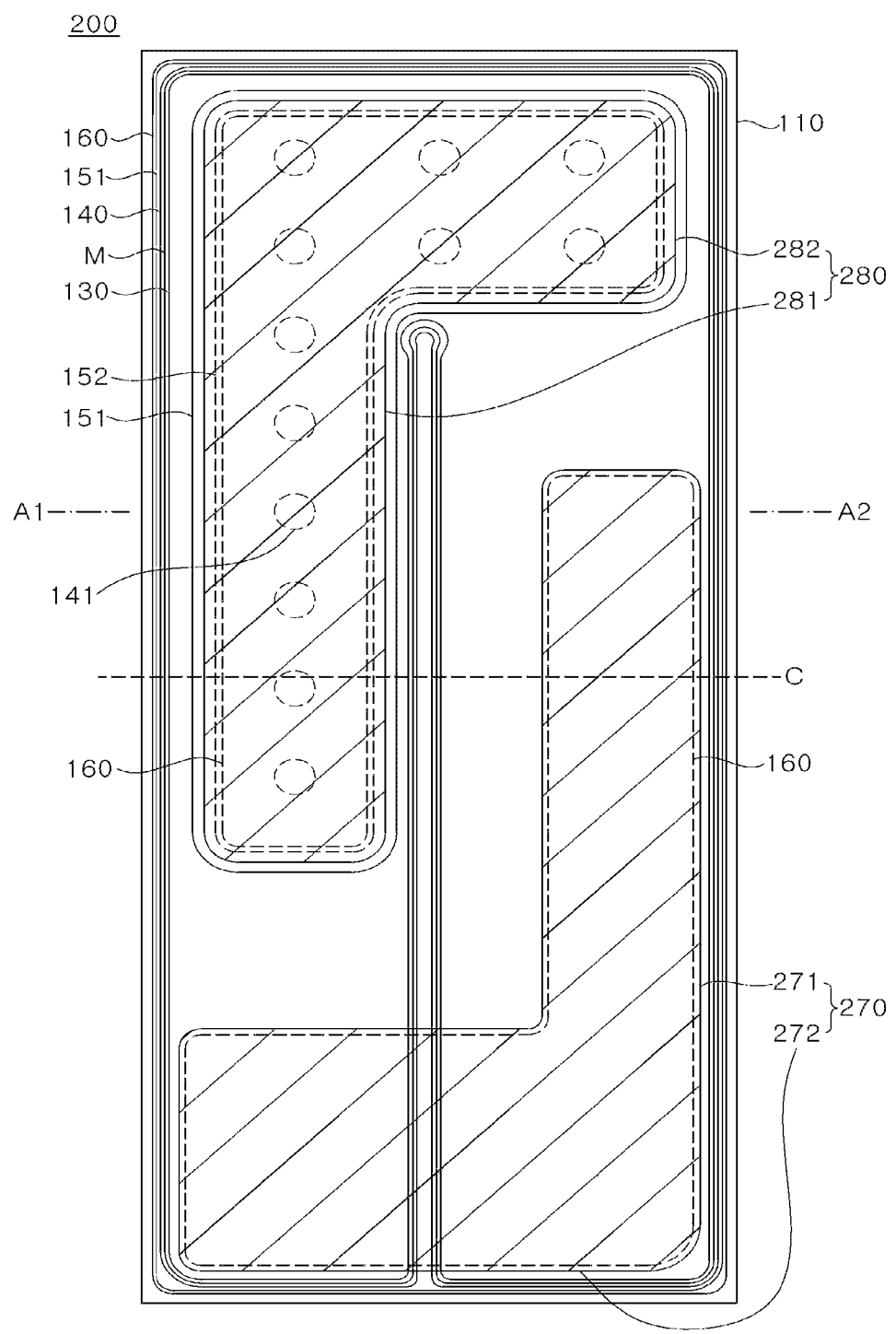
FIG. 3 is a view of a light emitting diode chip according to a second embodiment of the present disclosure.

FIG. 3 is a view of a light emitting diode chip according to a second embodiment of the present disclosure. FIG. 3 is a bottom view of the light emitting diode chip 200 according to the second embodiment.

Description of the same components of the light emitting diode chip 200 according to the second embodiment as those of the light emitting diode chip 100 (see FIG. 1 and FIG. 2) according to the first embodiment will be omitted. For details of the same components, refer to the description of the light emitting diode chip 100 (see FIG. 1 and FIG. 2) according to the first embodiment.

The first opening 161 of the second insulation layer 160 is formed along one long side of the substrate 110 and is continuously formed along one short side thereof. In addition, the second opening 162 of the second insulation layer 160 is formed along the other long side of the substrate 110 and is continuously formed along the other short side thereof. Further, the first opening 161 and the second opening 162 of the second insulation layer 160 are placed to intersect with the central line of the substrate 110. With this structure, the light emitting diode chip 200 includes a first bump pad 270 formed on the first opening 161 of the second insulation layer 160 and a second bump pad 280 formed on the second opening 162. The first bump pad 270 includes a first length portion 271 and a first extending portion 272.

The first length portion 271 is formed in an elongated shape along one long side of the substrate 110. The first length portion 271 is the same as the first bump pad 170 (see FIG. 1 and FIG. 2) of the light emitting diode chip 100 (see FIG. 1 and FIG. 2) according to the first embodiment.

The first extending portion 272 extends from one end of the first length portion 271 and is formed along one short side of the substrate 110. That is, the first extending portion 272 protrudes from the first length portion 271 toward the other long side of the substrate 110.

The second bump pad 280 includes a second length portion 281 and a second extending portion 282.

The second length portion 281 is formed in an elongated shape along the other long side of the substrate 110. The second length portion 281 is the same as the second bump pad 180 (see FIG. 1 and FIG. 2) of the light emitting diode chip 100 (see FIG. 1 and FIG. 2) according to the first embodiment.

The second extending portion 282 extends from one end of the second length portion 281 and is formed along the other short side of the substrate 110. That is, the second extending portion 282 protrudes from the second length portion 281 toward one long side of the substrate 110.

As such, the first bump pad 270 and the second bump pad 280 are disposed such that the first length portion 271 faces at least a portion of the second length portion 281 and the first extending portion 272 faces at least a portion of the second extending portion 282. In addition, the first length portion 271 of the first bump pad 270 and the second length portion 281 of the second bump pad 280 are disposed to intersect with the central line C.

With the structure of the first length portion 271 of the first bump pad 270 and the second length portion 281 of the second bump pad 280, the light emitting diode chip 200 according to this embodiment can be prevented from being bent or broken.

In addition, since the light emitting diode chip 200 includes the first extending portion 272 extending from the first length portion 271 and the second extending portion 282 extending from the second length portion 281, the first bump pad 270 and the second bump pad 280 have larger areas than those of the light emitting diode chip according to the first embodiment. Accordingly, the light emitting diode chip 200 have a large bonding area with respect to external components. Further, the large areas of the first bump pad 270 and the second bump pad 280 facilitate contact of probes upon testing of the light emitting diode chip 200 or a package including the light emitting diode chip. That is, the probes are brought into contact with broad regions of the first bump pad 270 and the second bump pad 280, thereby ensuring reliable testing by preventing test errors due to contact failure.

Figure 4:
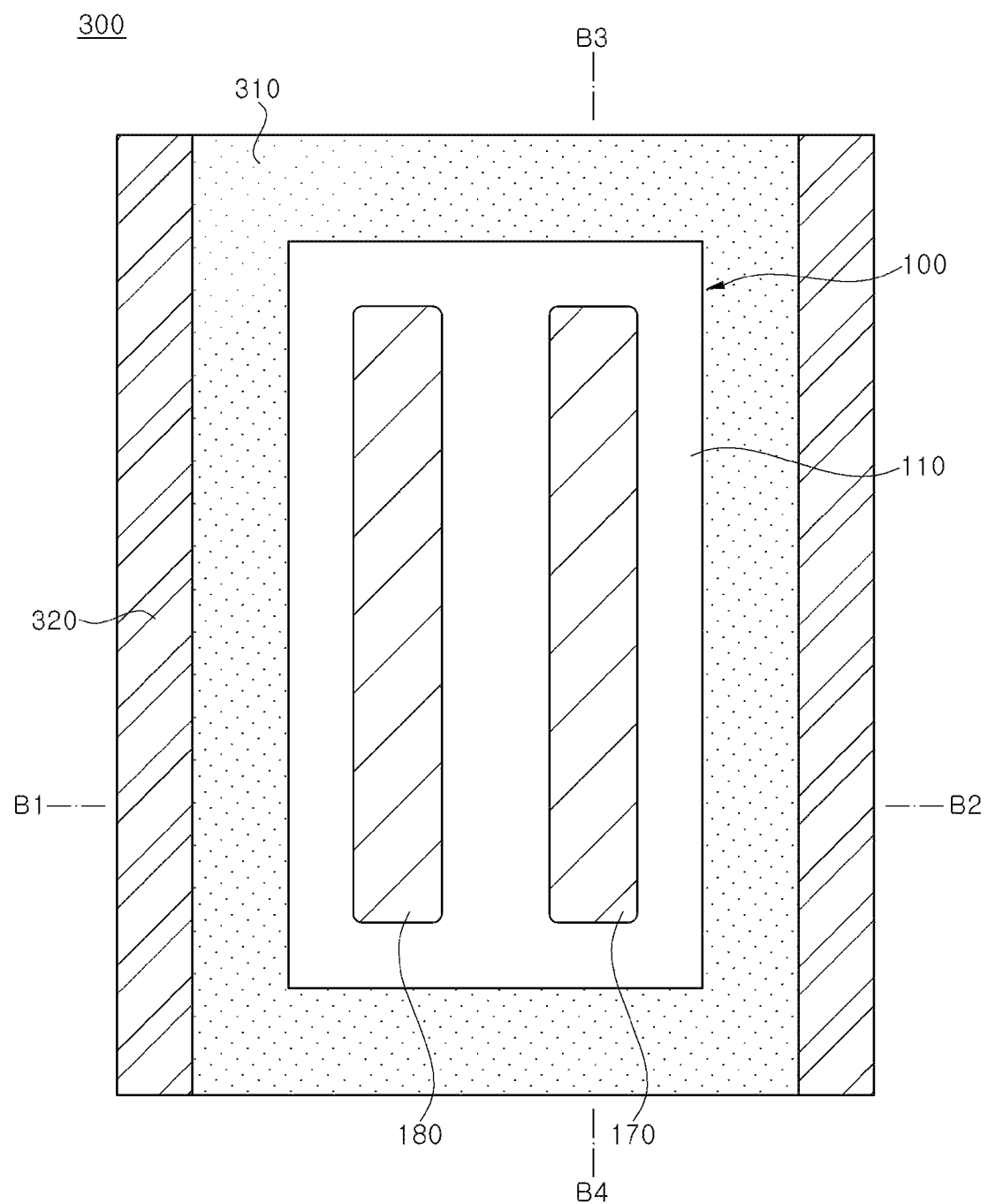
FIG. 4 is a plan view of the light emitting device 300 according to the first embodiment of the present disclosure.
Figure 5:
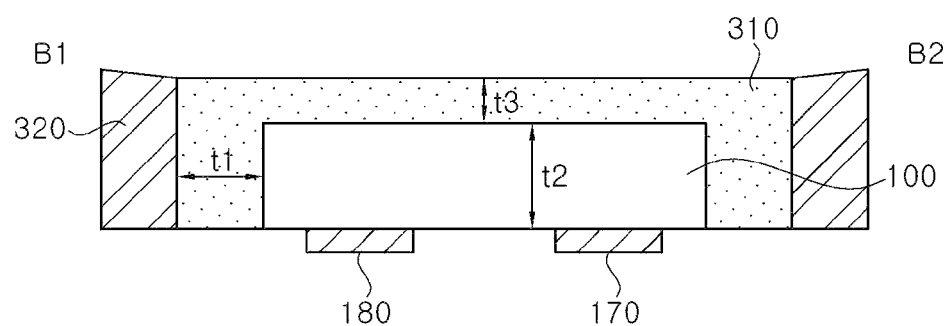
FIG. 5 is a side-sectional view (B1-B2) of the light emitting device shown in FIG. 4.
Figure 6:
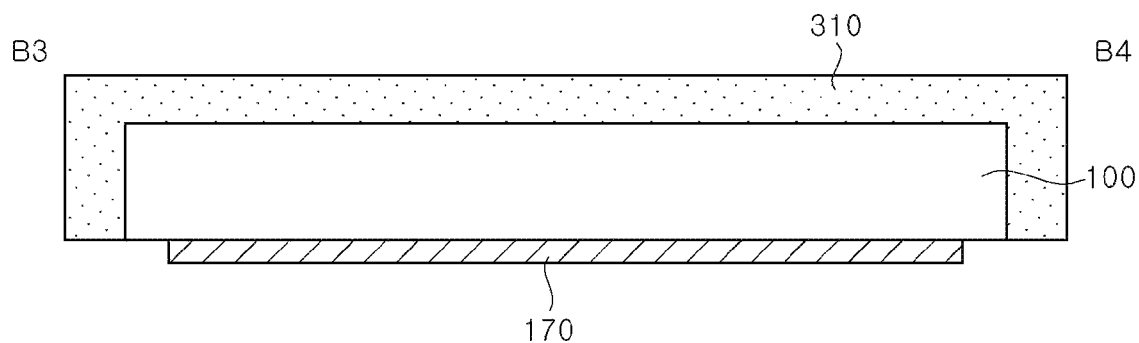
FIG. 6 is another side-sectional view (B3-B4) of the light emitting device shown in FIG. 4.

FIG. 4 to FIG. 6 are views of a light emitting device according to a first embodiment of the present disclosure. FIG. 4 is a plan view of the light emitting device 300 according to the first embodiment, FIG. 5 is a side-sectional view (B1-B2) of the light emitting device shown in FIG. 4, and FIG. 6 is another side-sectional view (B3-B4) of the light emitting device shown in FIG. 4.

Referring to FIG. 4 to FIG. 6, the light emitting device 300 according to the first embodiment includes a light emitting diode chip 100, a wavelength conversion member 310, and a white barrier member 320.

In this embodiment, the light emitting diode chip 100 is described in connection with FIG. 1 and FIG. 2 and for details of the interior configuration and structure of the light emitting diode chip 100, the descriptions and FIG. 1 and FIG. 2 can be referred. It should be understood that the light emitting diode chip 100 of the light emitting device 300 according to the first embodiment is not limited to the light emitting diode chip 100 (see FIG. 1 and FIG. 2) according to the first embodiment and may be the light emitting diode chip 200 (see FIG. 3) according to the second embodiment.

The wavelength conversion member 310 is formed to surround upper and side surfaces of the light emitting diode chip 100. The wavelength conversion member 310 serves to convert wavelengths of light emitted from the light emitting diode chip 100 such that the light emitting device 300 can emit white light or other colors of light. By way of example, the wavelength conversion member 310 may be a phosphor layer in which phosphors for conversion of wavelengths of light are mixed with a transparent resin. For example, the transparent resin may be a transparent silicone resin. The phosphors may include yellow phosphors, red phosphors, green phosphors, and the like.

Examples of the yellow phosphors may include YAG:Ce $(T_3Al_5O_{12}:Ce)$-based phosphors, which are cerium (Ce)-doped yttrium (Y)-aluminum (Al) garnets, and silicate-based phosphors, which have a main wavelength of 530 nm to 570 nm.

Examples of the red (R) phosphors may include YOX $(Y_2O_3:EU)$-based phosphors composed of a compound of yttrium oxide $(Y_2O_3)$ and europium (Eu), and nitride phosphors, which have a main wavelength of 611 nm.

Examples of the green (G) phosphors may include LAP (LaPO4:Ce,Tb)-based phosphors having a main wavelength of 544 nm and composed of a compound of phosphate $(PO_4)$, lanthanum (La) and terbium (Tb).

In some embodiments, the wavelength conversion member 310 may include blue phosphors. Examples of the blue (B) phosphors may include BAM $(BaMgAl_{10}O_{17}:EU)$-based phosphors having a main wavelength of 450 nm and composed of a compound of a barium (Ba), magnesium (Mg), aluminum oxide and europium (Eu).

In addition, the phosphors may include fluoride compound KSF phosphors $(K_2SiF_6)$, which are $Mn^{4+}$ active phosphors advantageous for high color reproduction.

According to this embodiment, a thickness t1 of the wavelength conversion member 310 formed on the side surface of the light emitting diode chip 100 is smaller than a thickness t2 of the light emitting diode chip 100, as shown in FIG. 5. Here, the thickness of the light emitting diode chip 100 refers to a thickness from an upper surface of the light emitting diode chip 100 to a lower surface thereof.

In addition, the thickness t1 of the wavelength conversion member 310 formed on the side surface of the light emitting diode chip 100 is greater than a thickness t3 of the wavelength conversion member 310 formed on the upper surface of the light emitting diode chip 100, a shown in FIG. 5.

If the thickness t1 of the wavelength conversion member 310 formed on the side surface of the light emitting diode chip 100 is too thin, light emitted from the side surface of the light emitting diode chip 100 can be reflected by a side surface of the white barrier member 320 and can be absorbed into the light emitting diode chip 100. To prevent this problem, a sufficient separation distance is set between the side surface of the light emitting diode chip 100 and the side surface of the white barrier member 320. Here, the side surface of the white barrier member 320 refers to an inner wall thereof facing the side surface of the light emitting diode chip 100. Accordingly, the wavelength conversion member 310 between the side surface of the light emitting diode chip 100 and the side surface of the white barrier member 320 is formed to have a sufficient thickness. However, if the thickness t1 of the wavelength conversion member 310 formed on the side surface of the light emitting diode chip 100 is thick, the size of the light emitting device 300 can be increased. Accordingly, the thickness t1 of the wavelength conversion member 310 formed on the side surface of the light emitting diode chip 100 may be smaller than the thickness t2 of the light emitting diode chip 100.

The white barrier member 320 covers opposite long side surfaces of the wavelength conversion member 310. Referring to FIG. 4, the white barrier member 320 covers the side surfaces of the wavelength conversion member 310 along the opposite long sides of the substrate 110 such that the side surfaces of the wavelength conversion member 310 covering the opposite short sides of the substrate 110 are exposed. Since the white barrier member 320 is formed to cover only the opposite long side surfaces of the wavelength conversion member 310, lower surfaces of the wavelength conversion member 310 and the light emitting diode chip 100 are exposed.

With this structure of the white barrier member 320, the first bump pad 170 and the second bump pad 180 of the light emitting diode chip 100 protrude from a lower surface of the light emitting device 300. With the first bump pad 170 and the second bump pad 180 protruding therefrom, the light emitting device 300 can be easily aligned to external pads of an external component. Accordingly, the light emitting device 300 according to this embodiment ensures reliable bonding to external components. Although not shown in FIG. 4 to FIG. 6, an electrically conductive bonding member for bonding to external components may be disposed on the lower surfaces of the first bump pad 170 and the second bump pad 180 of the light emitting device 300. In the light emitting device 300 according to this embodiment, since the first bump pad 170 and the second bump pad 180 are exposed, it is possible to use not only a paste type bonding member, such as solders, but also a film type bonding member. The film type bonding member has lower flowability than the paste type bonding member and can reduce short circuit between the first bump pad 170 and the second bump pad 180.

An upper surface of the white barrier member 320 has an inclination. One end of the upper surface of the white barrier member 320 may be disposed collinear with an upper surface of the wavelength conversion member 310. Here, the one end of the upper surface of the white barrier member 320 refers to a side including an upper corner of the inner wall of the upper surface thereof and the other end thereof refers to a side including an upper corner of an outer wall thereof. Further, the upper surface of the white barrier member 320 has a height gradually increasing from the inner wall of the white barrier member 320 to the outer wall thereof.

In a structure wherein one end of the upper surface of the white barrier member 320 is placed above the upper surface of the wavelength conversion member 310, some fraction of light emitted through the wavelength conversion member 310 collides with the inner wall of the white barrier member 320. That is, a beam angle of the light emitting device 300 is narrowed, thereby reducing light extraction efficiency.

Further, in a structure where one end of the upper surface of the white barrier member 320 is placed below the upper surface of the wavelength conversion member 310, the upper surface of the white barrier member 320 can be partially covered thereby due to a process or an external environment. In this case, light emitted from the light emitting diode chip 100 fails to reach the wavelength conversion member 310 on the white barrier member 320 and a portion of the wavelength conversion member 310 emits a color corresponding to the phosphors in the wavelength conversion member 310.

Accordingly, the one end of the upper surface of the white barrier member 320 is disposed collinear with the upper surface of the wavelength conversion member 310, with the other end of the upper surface thereof disposed above the one end thereof so as to prevent the wavelength conversion member 310 from covering the upper surface of the white barrier member 320.

Alternatively, the inclination of the upper surface of the white barrier member 320 may be changed to change the beam angle of light emitted from the light emitting device 300. The white barrier members 320 may be formed of epoxy molding compound (EMC) or silicone molding compound (SMC).

Figure 7:
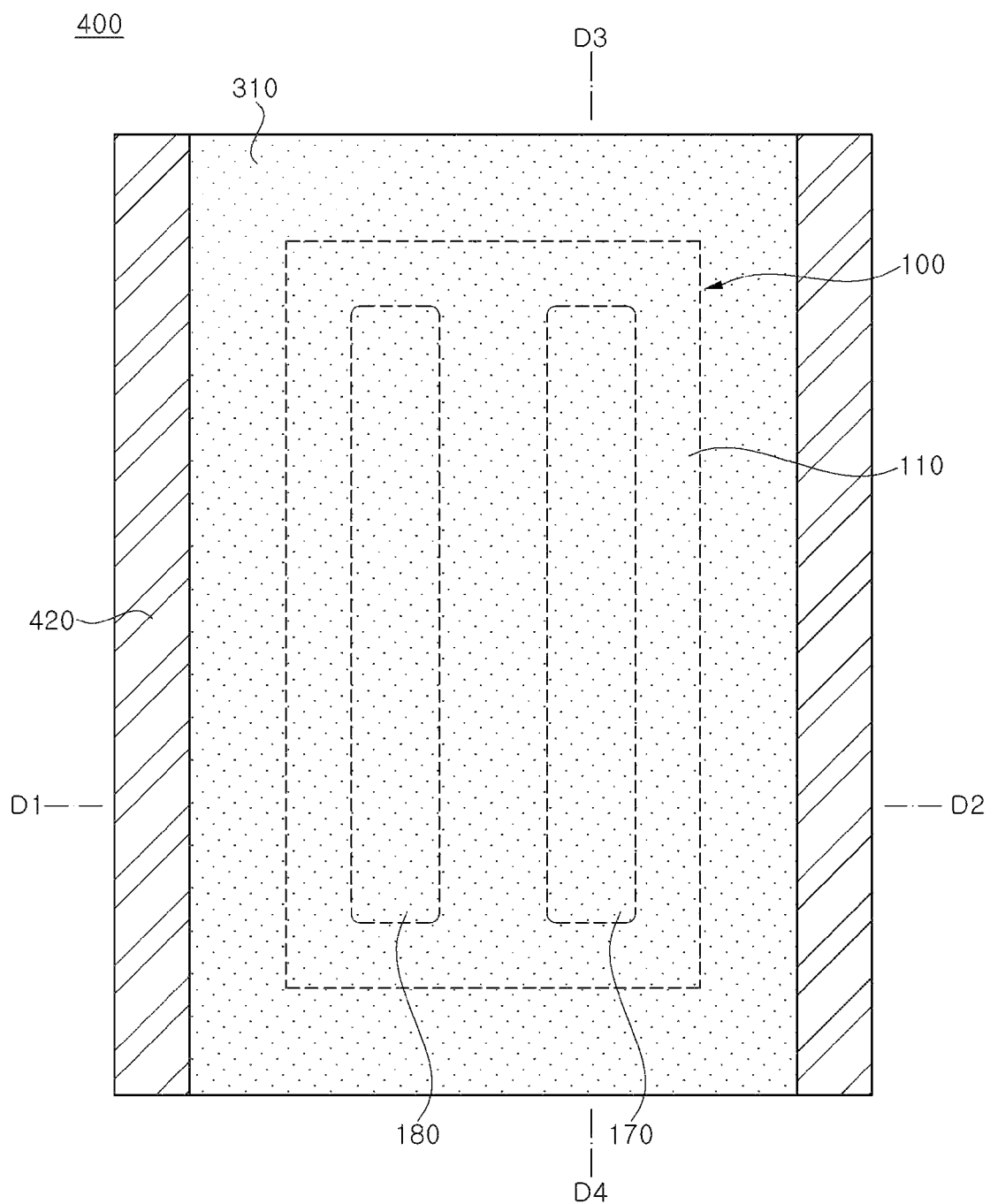
FIG. 7 to FIG. 9 are views of a light emitting device according to a second embodiment of the present disclosure.
Figure 8:
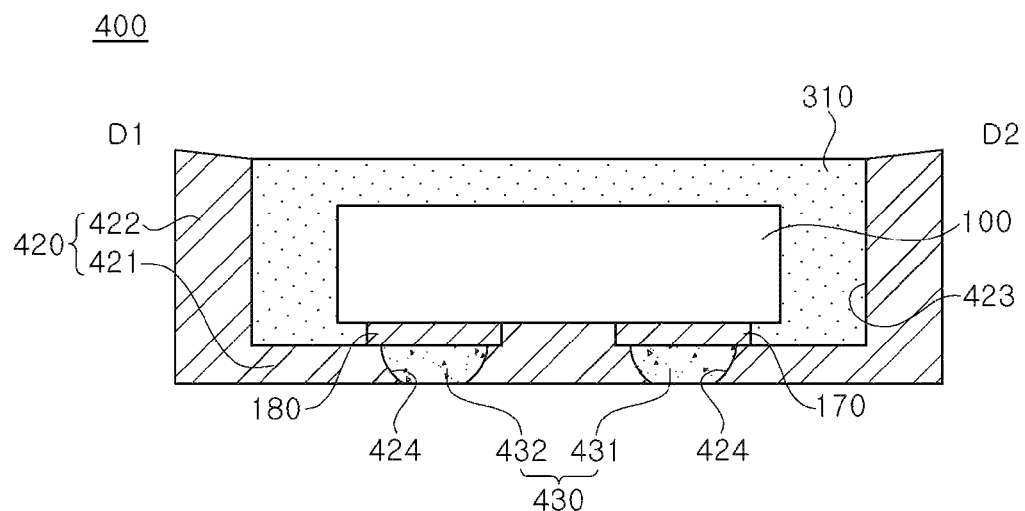
Figure 9:
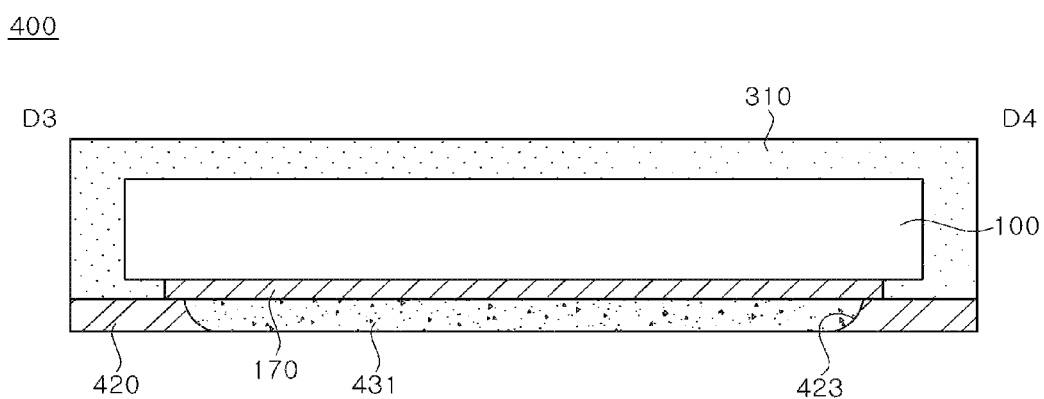

FIG. 7 to FIG. 9 are views of a light emitting device according to a second embodiment of the present invention. FIG. 7 is a plan view of the light emitting device 400 according to the second embodiment, FIG. 8 is a side-sectional view (D1-D2) of the light emitting device shown in FIG. 7, and FIG. 9 is another side-sectional view (D3-D4) of the light emitting device shown in FIG. 7.

Referring to FIG. 7 to FIG. 9, the light emitting device 400 according to the second embodiment includes a light emitting diode chip 100, a wavelength conversion member 310, and a white barrier member 420. In this embodiment, the light emitting device 400 includes the light emitting diode chip 100 (see FIG. 1 and FIG. 2) according to the first embodiment. Accordingly, details of the interior configuration and structure of the light emitting diode chip 100 can be referred to along with FIG. 1 and FIG. 2.

The white barrier member 420 includes a bottom portion 421 and a side portion 422, as shown in FIG. 8. Here, the bottom portion 420 includes a bottom surface, on which the light emitting diode chip 100 is mounted, and the side portion 422 includes the side surface of the light emitting diode chip 100.

The bottom portion 421 of the white barrier member 420 is disposed on the lower surface of the light emitting diode chip 100 to cover the lower surface thereof. The side portion 422 of the white barrier member 420 is disposed on the bottom portion 421 to cover the side surface of the wavelength conversion member 310. That is, the light emitting device 400 has a structure where the light emitting diode chip 100 having the wavelength conversion member 310 is mounted in a cavity 423 defined by the bottom portion 421 and the side portion 422. The white barrier member 420 may be formed of a material reflecting light. Alternatively, a reflective material may be coated on the inner wall of the white barrier member 420 defining the cavity 423.

The bottom portion 421 is formed to have an upper surface partially protruding upwards. The upwardly protruding portion of the bottom portion is placed between the first bump pad 170 and the second bump pad 180 of the light emitting device 400 when the light emitting device 400 is mounted in the cavity 423 of the white barrier member 420.

The protruding portion of the bottom portion 421 serves to guide the light emitting device 400 to be mounted at a suitable location. Thus, the light emitting device 400 can be mounted at an accurate location by the protruding portion of the bottom portion 421. As a result, accurate alignment between the light emitting device 400 and the electrically conductive bonding member 430 can be achieved.

The bottom portion 421 is formed with a plurality of through-holes 424. The through-holes 424 are filled with the electrically conductive bonding member 430. For example, the electrically conductive bonding member 430 may be solders.

The through-holes 424 have inclined inner walls. Since the inner walls of the through-holes 424 are inclined, a bonding area between the through-holes 424 and the electrically conductive bonding member 430 is increased, as compared with a structure wherein the through-holes 424 have vertical inner walls. As a result, bonding strength between the electrically conductive bonding member 430 and the white barrier member 420 can be increased. Furthermore, a path from the lower surface of the white barrier member 420 to the first bump pad 170 and the second bump pad 180 of the light emitting diode chip 100 increases. As a result, the light emitting device 400 suffers from less problems caused by intrusion of external moisture or dust.

In addition, the through-holes 424 may have a width gradually decreasing from an upper portion thereof in a downward direction. Accordingly, after the electrically conductive bonding member 430 filling the through-holes 424 is cured, the electrically conductive bonding member 430 can be prevented from being separated from the white barrier member 420 due to external impact.

Further, upper portions of the through-holes 424 have a smaller width than the lower surfaces of the first bump pad 170 and the second bump pad 180 of the light emitting diode chip 100. Accordingly, the electrically conductive bonding member 430 filling the through-holes 424 has a smaller width than the first bump pad 170 and the second bump pad 180. Accordingly, when a slight alignment error occurs upon mounting of the light emitting diode chip 100 on the white barrier member 420, it is possible to prevent contact failure between the light emitting diode chip 100 and the electrically conductive bonding member 430.

The electrically conductive bonding member 430 has a tapered shape such that a width gradually decreases from an upper portion thereof in the downward direction. Accordingly, when the light emitting device 400 is secured to an external component, accurate bonding between the light emitting device 400 and the external component can be easily achieved.

In addition, since the width of each of the through-holes 424 gradually decreases in the downward direction, a distance between a first electrically conductive bonding member 431 and a second electrically conductive bonding member 432 gradually increases in the downward direction. Here, the first electrically conductive bonding member 431 is bonded to the first bump pad 170 and the second electrically conductive bonding member 432 is bonded to the second bump pad 180. Accordingly, when the light emitting device 400 is connected to an external component, it is possible to prevent short circuit through simultaneous contact of the first electrically conductive bonding member 431 and the second electrically conductive bonding member 432 to one pad of the external component.

The electrically conductive bonding member 430 filling the plurality of through-holes 424 is connected to the first bump pad 170 and the second bump pad 180 of the light emitting diode chip 100 disposed in the cavity 423 of the white barrier member 420. Then, the first bump pad 170 and the second bump pad 180 are connected to the electrically conductive bonding member 430 filling different through-holes 424.

For example, the through-holes 424 may be formed corresponding to the first bump pad 170 and the second bump pad 180 of the light emitting diode chip 100. However, it should be understood that the structure of the through-holes 424 is not limited thereto. The through-holes 424 may have any structure so long as the light emitting diode chip 100 can be electrically connected to an external component through the electrically conductive bonding member 430 filling the through-holes 424.

In description of the light emitting device according to this embodiment, the light emitting diode chip 100 (see FIG. 1 and FIG. 2) according to the first embodiment is illustrated by way of example. However, it should be understood that the light emitting device according to this embodiment may employ the light emitting diode chip 200 (FIG. 3) according to the second embodiment.

Figure 10:
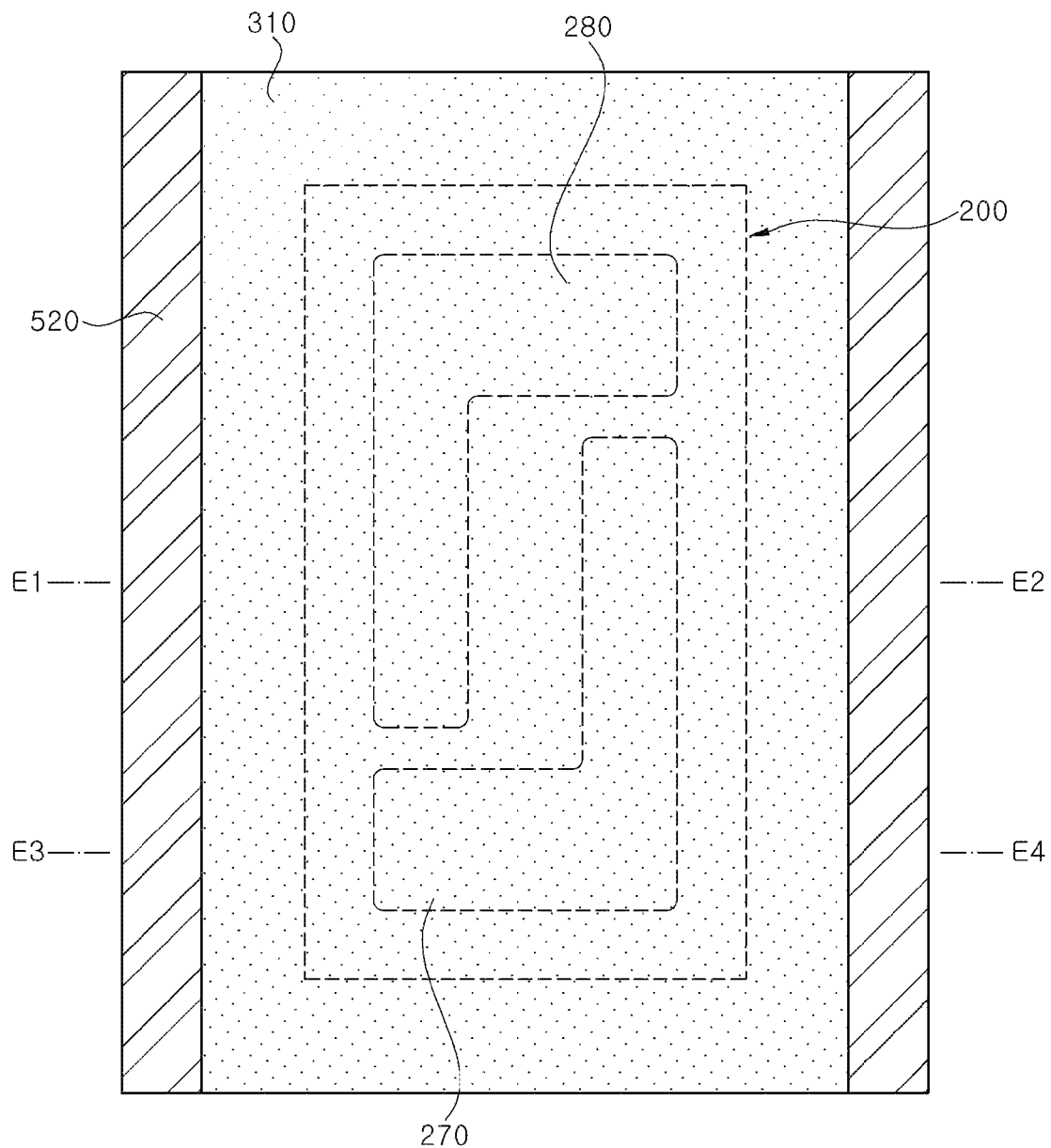
FIG. 10 to FIG. 12 are views of a light emitting device according to a third embodiment of the present disclosure.
Figure 11:
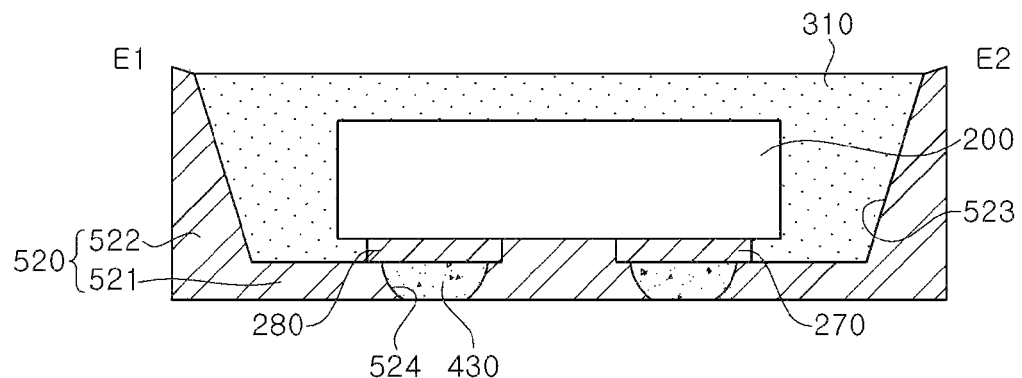
Figure 12:
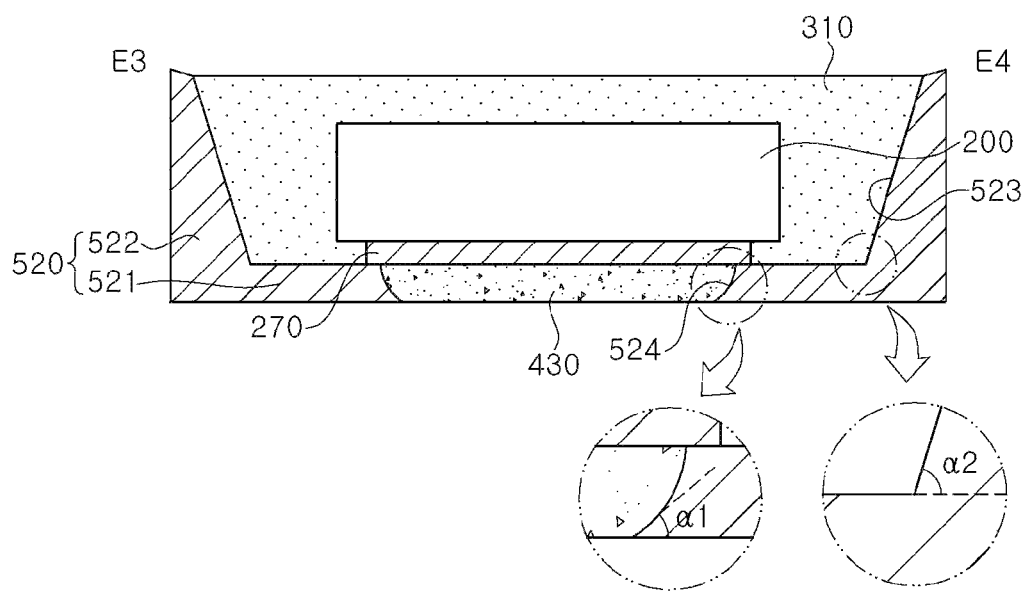

FIG. 10 to FIG. 12 are views of a light emitting device according to a third embodiment of the present disclosure. FIG. 10 is a plan view of the light emitting device 500 according to the third embodiment, FIG. 11 is a side-sectional view (E1-E2) of the light emitting device shown in FIG. 10, and FIG. 12 is a side-sectional view (E3-E4) of the light emitting device shown in FIG. 10.

Referring to FIG. 10 to FIG. 12, the light emitting device 500 according to the third embodiment includes a light emitting diode chip 200, a wavelength conversion member 310, and a white barrier member 520.

The light emitting device 500 according to the third embodiment includes the light emitting diode chip 200 (see FIG. 3) according to the second embodiment. Although the light emitting device 500 according to this embodiment is illustrated as including the light emitting diode chip 200 (see FIG. 3) according to the second embodiment, it should be understood that the light emitting device 500 according to this embodiment includes the light emitting diode chip 100 (see FIG. 1 and FIG. 2) according to the first embodiment.

The white barrier member 520 includes a bottom portion 521 and a side portion 522, as shown in FIGS. 11-12. The bottom portion 521 of the white barrier member 520 is formed with through-holes 524 corresponding to the first bump pad 270 and the second bump pad 280 of the light emitting diode chip 200. The structure of the through-holes 524 (taken along lines E1-E2 and E3-E4) of FIG. 10 is shown in FIG. 11 and FIG. 12.

In the white barrier member 520 of the light emitting device 500 according to the third embodiment, an inner wall of the side portion 522 has an inclination. That is, the side portion 522 of the white barrier member 520 is formed to define a cavity 523 having a diameter gradually increasing from a lower surface thereof to an upper surface thereof, as shown in FIGS. 11-12. The inclined inner wall of the side portion 522 of the white barrier member 520 can reflect light emitted from the side surface of the light emitting diode chip 200 in an upward direction. As a result, the light emitting device 500 can have improved luminous efficacy.

Further, the white barrier member 520 is formed with the through-holes 524 filled with the electrically conductive bonding member 430. The inner wall of the white barrier member 520 defining the through-holes 524 also has an inclination. In the white barrier member 520, the inner wall of the white barrier member 520 defining the cavity 523 has a different inclination than the inner wall of the white barrier member 520 defining the through-holes 524. For example, an inclination angle α1 of the inner wall of the white barrier member 520 defining the through-holes 524 may be greater than an inclination angle α2 of the inner wall of the white barrier member 520 defining the cavity 523. As the inclination angle α1 of the inner wall of the white barrier member 520 defining the through-holes 524 decreases, a bonding area between the white barrier member 520 and the electrically conductive bonding member 430 increases.

Figure 13:
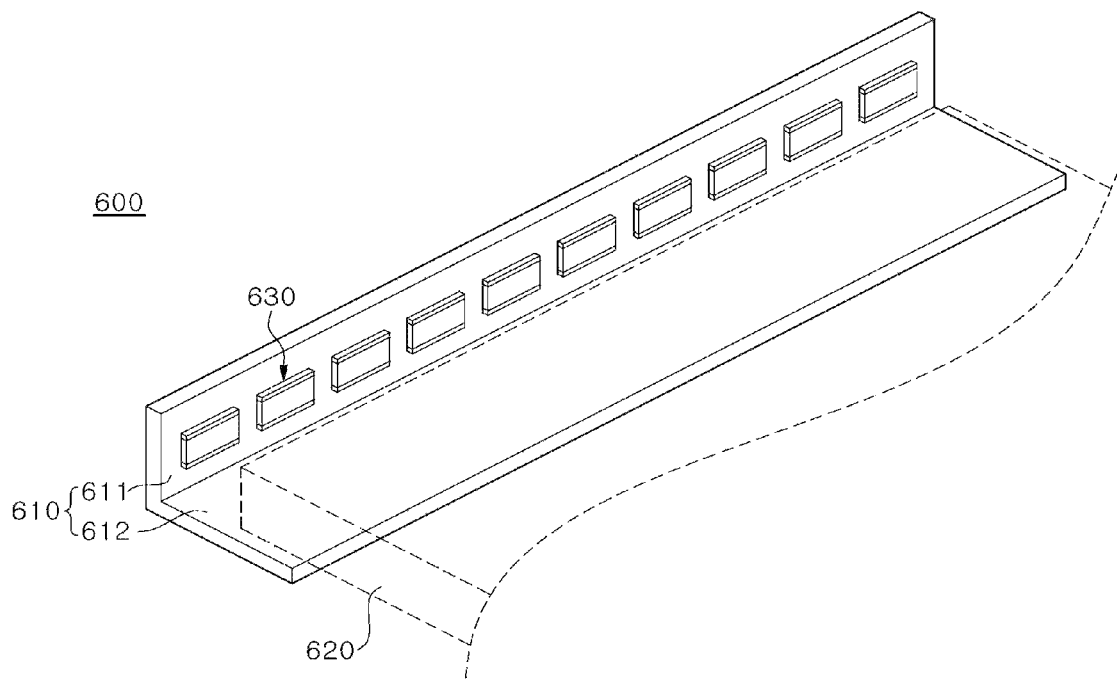
FIG. 13 is a view of a light emitting module according to a first embodiment of the present disclosure.

FIG. 13 is a view of a light emitting module according to a first embodiment of the present disclosure. Referring to FIG. 13, the light emitting module 600 according to the first embodiment includes a circuit board 610 and light emitting devices 630.

The light emitting devices 630 are mounted on the circuit board 610. In addition, the circuit board 610 is formed with interconnection lines electrically connected to the light emitting device 630 mounted thereon. For example, the circuit board 610 may be a printed circuit board or a flexible printed circuit board including interconnection lines on an insulation layer. Alternatively, the circuit board 610 may be a metal board including interconnection lines on an insulation layer formed on a metal layer. Alternatively, the circuit board 610 may be a ceramic substrate or a synthetic resin board, such as a resin, glass, or epoxy substrate. Alternatively, the circuit board 610 may include at least one selected from the group consisting of an epoxy molding compound (EMC), polyimide (PI), ceramic, graphene, glass synthetic fibers, and combinations thereof.

The circuit board 610 is divided into a first region 611 and a second region 612. The light emitting devices 630 are disposed in the first region 611. In the first region 611, the light emitting devices 630 are electrically connected to the interconnection line of the circuit board 610. Although not shown in the drawings, the first region 611 of the circuit board 610 is formed with a circuit pattern for electrical connection to the light emitting devices 630. The circuit pattern formed on the circuit board 610 corresponds to lower surfaces of bump pads (not shown) of the light emitting device 630.

The first region 611 is disposed to face a side surface of a light guide plate 620 that receives light emitted from the light emitting device 630. The second region 612 is perpendicular to the first region 611. That is, the second region 612 protrudes from the first region 611 toward the light guide plate 620, or is disposed to face a lower surface of the light guide plate 620.

The circuit board 610 is provided with a plurality of light emitting devices 630 in the first region 611. The light emitting diode devices 630 may be packages including the light emitting diode chips 100 or 200 (see FIG. 1 to FIG. 3) according to the first or second embodiment described above.

For example, the circuit board 610 may be formed in the first region 611 with a pair of circuit patterns extending parallel to each other in the longitudinal direction and exposed to the outside of the light emitting module 600. With this structure, the circuit board 610 may be provided with the light emitting device 630 including the light emitting diode chips 100 (see FIG. 1 and FIG. 2) according to the first embodiment.

Alternatively, the circuit board 610 may be formed in the first region 611 with a pair of circuit patterns extending in the longitudinal direction thereof, bent toward each other and exposed to the outside. Here, one circuit pattern may be bent at one end thereof toward the other circuit pattern and the other circuit pattern may be bent at one end thereof toward the one circuit pattern. With this structure, the circuit board 610 may be provided with the light emitting devices 630 each including the light emitting diode chip 200 (see FIG. 1 and FIG. 2) according to the second embodiment.

Further, the light emitting devices 630 may have a structure including the white barrier member of the light emitting devices 300, 400, 500 (see FIG. 3 to FIG. 12) according to the first to third embodiments. For details of the light emitting diode chip, the wavelength conversion member and the white barrier member constituting the light emitting device 630, refer to the description with reference to FIG. 1 to FIG. 12 above.

The plural light emitting devices 630 are arranged linearly in the longitudinal direction of the first region 611. In the structure where the light emitting diode chip uses the light emitting diode chip 200 (see FIG. 3), the first bump pad 270 (see FIG. 3), or the second bump pad (see FIG. 3) is formed along the short side of the light emitting diode chip. As such, since one bump pad is formed along each of the opposite short sides of the light emitting diode chip 200 (see FIG. 3), there is no separation space between the bump pads. Accordingly, the light emitting device 630 can reflect light emitted from a side surface of another light emitting device 630 adjacent thereto through the bump pads instead of absorbing the light. Accordingly, the light emitting module 600 can suppress generation of dark spots between the light emitting devices 630 while improving light extraction efficiency.

In one embodiment, each of the first bump pad 270 (see FIG. 3) and the second bump pad 280 (see FIG. 3) includes an Au layer to exhibit a color similar to yellow. In addition, the light emitting diode chip 200 (see FIG. 3) may emit blue light and the wavelength conversion member 310 (see FIG. 3) includes yellow phosphors. Since light emitted from the light emitting device 630 is excited light through the yellow phosphors, the light emitting device 630 can reflect light emitted from the side surface of another light emitting device 630 adjacent thereto using the first bump pad 270 (see FIG. 3) and the second bump pad 280 (see FIG. 3). Accordingly, the light emitting module 600 according to this embodiment can reflect light emitted from the side surface of the light emitting device 630, thereby improving light reflectivity.

Figure 14:
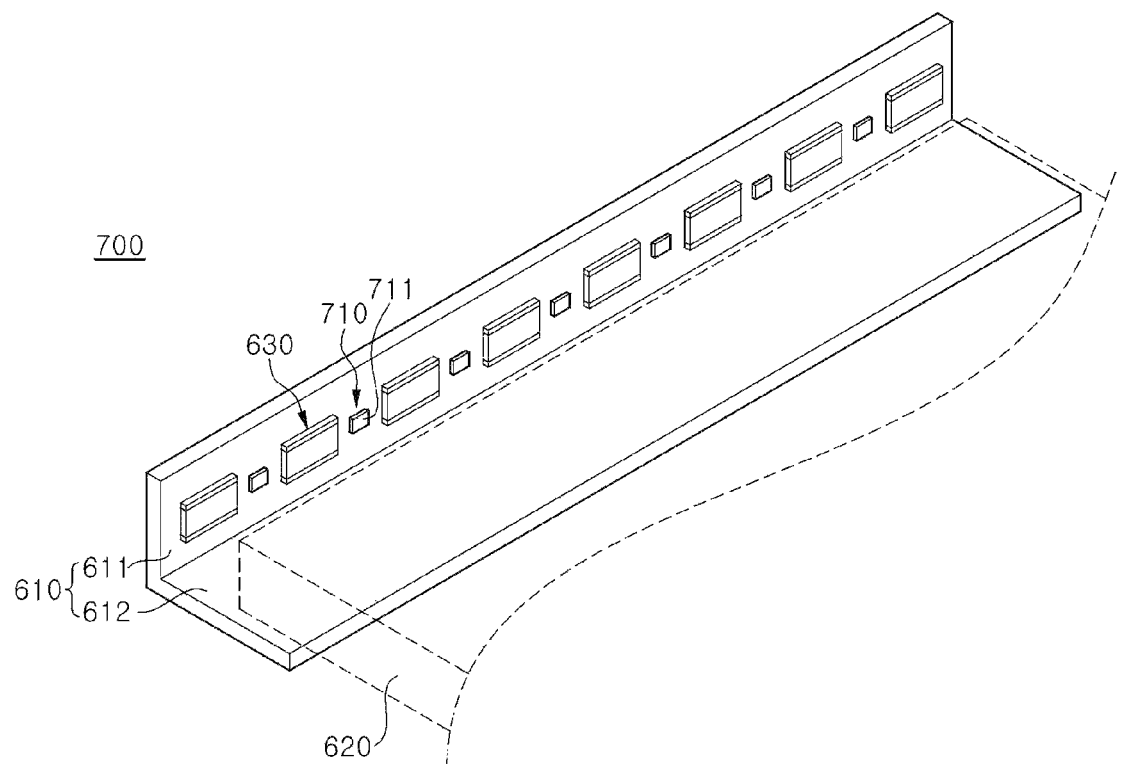
FIG. 14 is a view of a light emitting module according to a second embodiment of the present disclosure.

FIG. 14 is a view of a light emitting module according to a second embodiment of the present disclosure. Referring to FIG. 14, the light emitting module 700 according to the second embodiment includes a circuit board 610, light emitting devices 630, and Zener devices 710.

For details of the circuit board 610 and the light emitting device 630, descriptions of the circuit board and the light emitting device of the light emitting module 600 (see FIG. 13) according to the first embodiment can be referred.

The circuit board 610 is provided in the first region 611 with a plurality of light emitting devices 630 and a plurality of Zener devices 710. Each of the Zener devices 710 is disposed between the light emitting devices 630. Each of the Zener devices 710 is connected in parallel to each of the light emitting devices 630. The Zener devices 710 protect the light emitting diode chip by allowing abruptly high voltage, such as electrostatic discharge (ESD) or surge, to bypass the light emitting diode chip such that the high voltage is not applied to the light emitting diode chip.

Each of the Zener devices 710 is composed of a Zener diode chip (not shown) and a white barrier member 711 surrounding the Zener diode chip. The white barrier member 711 of the Zener device 710 may be formed of a silicone resin or an epoxy resin.

In this embodiment, light emitted from the light emitting device 630 toward the Zener device 710 is reflected by the white barrier member 711 of the Zener device 710. The reflected light may travel toward the side surface of the light guide plate 620, thereby improving luminous efficacy of the light emitting module 700.

Figure 15:
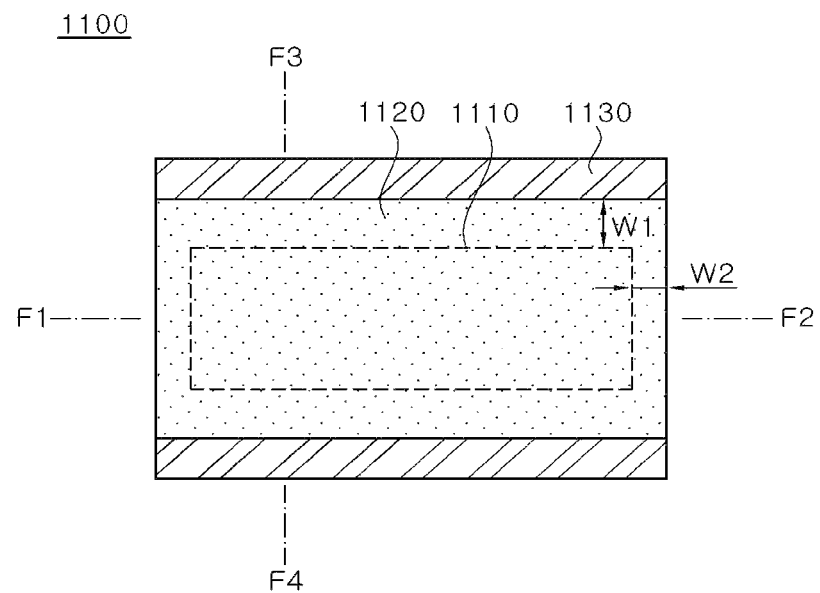
FIG. 15 to FIG. 18 are views of a light emitting device according to a fourth embodiment of the present disclosure.
Figure 16:
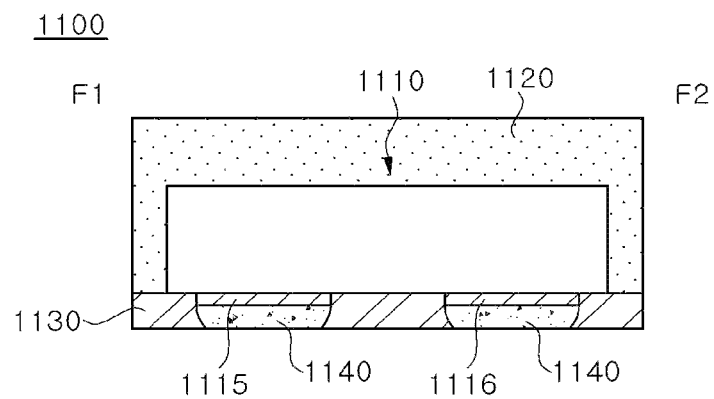
Figure 17:
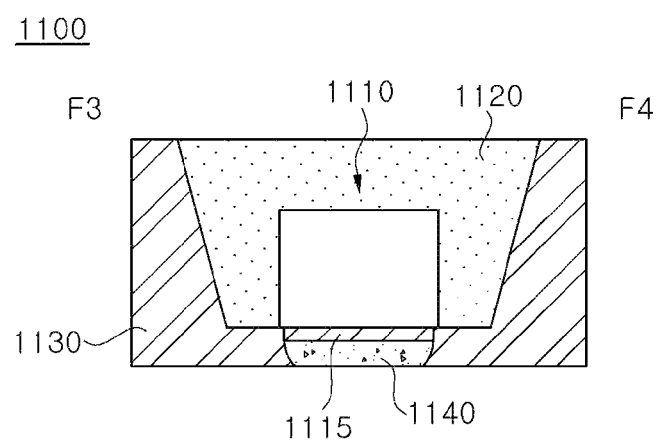
Figure 18:
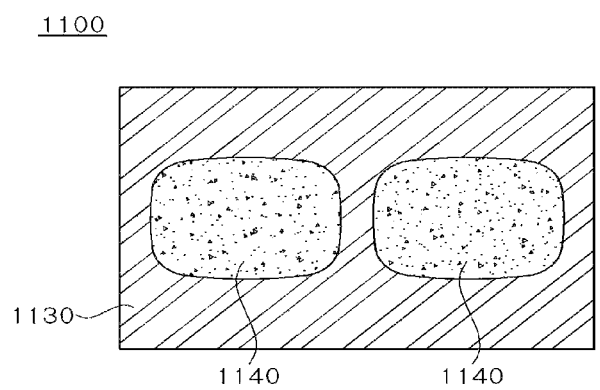

FIG. 15 to FIG. 18 are views of a light emitting device according to a third embodiment of the present disclosure. FIG. 15 is a plan view of the light emitting device 1100 according to the third embodiment. FIG. 16 and FIG. 17 are cross-sectional views (F1-F2, F3-F4) of the light emitting device 1100 according to the third embodiment. In addition, FIG. 18 is a bottom view of the light emitting device 1100 according to the third embodiment.

The light emitting device 1100 according to the third embodiment includes a light emitting diode chip 1110, a wavelength conversion member 1120, a white barrier member 1130, and an electrically conductive bonding member 1140 (FIGS. 16-17).

A lower periphery of the light emitting diode chip 1110 according to this embodiment has a rectangular cross-section having short sides and long sides. Herein, the long sides refer to sides of the lower periphery having a longer length than the short sides of the lower periphery.

The light emitting diode chip 1110 includes a light emitting structure, an ohmic reflective layer, a pad metal layer and a bump pad patterned and stacked on the substrate. For detailed descriptions of the light emitting structure, the ohmic reflective layer and the pad metal layer of the light emitting diode chip 1110, refer to the above description of the light emitting diode chip. In the light emitting diode chip 1110 according to this embodiment, a first bump pad 1115 and a second bump pad 1116 may be disposed parallel to each other along the long sides thereof, as shown in FIG. 16 and FIG. 18. In addition, the first bump pad 1115 and the second bump pad 1116 may have a symmetrical structure.

The wavelength conversion member 1120 is formed to surround the upper and side surfaces of the light emitting diode chip 1110. The wavelength conversion member 1120 serves to convert wavelengths of light emitted from the light emitting diode chip 1110 such that the light emitting device 1100 can emit white light or other colors of light. By way of example, the wavelength conversion member 1120 may be formed of a mixture of a wavelength conversion material and a translucent resin. For example, the translucent resin may be a transparent silicone resin. In addition, the wavelength conversion material may be phosphors. Examples of the phosphors may include yellow phosphors, red phosphors, green phosphors, and the like. According to this embodiment, the wavelength conversion member 1120 converts the wavelength of light emitted from the light emitting diode chip 1110, but it is not limited thereto. Alternatively, a translucent resin free from the wavelength conversion material may be disposed to surround the light emitting diode chip 1110 instead of the wavelength conversion member 1120.

The white barrier member 1130 covers a lower surface of the light emitting diode chip 1110 and lower and side surfaces of the wavelength conversion member 1120. Referring to FIG. 16, the white barrier member 1130 covers the lower surface of the light emitting diode chip 1110 and the lower surface of the wavelength conversion member 1120 excluding lower portions of the first bump pad 1115 and the second bump pad 1116. A gap between the first bump pad 1115 and the second bump pad 1116 is also filled with the white barrier member 1130.

Referring to FIG. 15 and FIG. 17, the white barrier member 1130 covers opposite long side surfaces of the wavelength conversion member 1120. That is, the white barrier member 1130 exposes and does not cover opposite short side surfaces of the wavelength conversion member 1120.

Accordingly, the white barrier member 1130 exposes an upper surface and the opposite short side surfaces of the wavelength conversion member 1120 and a portion of the wavelength conversion member 1120 exposed by the white barrier member 1130 acts as a light exit surface. That is, the light emitting device 1100 according to this embodiment emits light through the upper surface and the opposite short side surfaces thereof. With this structure, the white barrier member 1130 narrows the beam angle of light emitted through the upper surface of the light emitting device 1100.

In addition, the inner wall of the white barrier member 1130 has an inclined structure, as shown in FIG. 17. The inner wall of the white barrier member 1130 is inclined to be gradually spaced apart from the side surfaces of the light emitting diode chip 1110 in the upward direction.

The inclined inner wall of the white barrier member 1130 may reflect light emitted from the side surfaces of the light emitting diode chip 1110 in the upward direction. Accordingly, the inner wall of the white barrier member 1130 reflects light emitted from the long side surfaces of the light emitting diode chip 1110 toward the upper surface thereof acting as a light exit surface, thereby improving luminous efficacy of the light emitting device 1100.

The white barrier member 1130 may be formed of an epoxy molding compound (EMC) or a silicone molding compound (SMC).

The electrically conductive bonding member 1140 is disposed under the light emitting diode chip 1110 to penetrate the white barrier member 1130, as shown in FIG. 16 as one example. The electrically conductive bonding member 1140 is connected to each of the first bump pad 1115 and the second bump pad 1116 of the light emitting diode chip 1110. In addition, as shown in FIG. 18, a lower surface of the electrically conductive bonding member 1140 is exposed to a lower surface of the white barrier member 1130. With this structure, the electrically conductive bonding member 1140 serves to electrically connect the light emitting diode chip 1110 to an external component. For example, the electrically conductive bonding member 1140 may be formed of solders.

According to this embodiment, a thickness W1 of the wavelength conversion member 1120 formed on the long side surfaces of the light emitting diode chip 1110 is greater than a thickness W2 of the wavelength conversion member 1120 formed on the short side surfaces of the light emitting diode chip 1110.

When the light emitting diode chip 1110 is placed close to the white barrier member 1130, light reflected by the white barrier member 1130 reenters the light emitting diode chip 1110, thereby causing deterioration in luminous efficacy of the light emitting device 1100. Accordingly, the light emitting diode chip 1110 and the white barrier member 1130 are spaced apart from each other to prevent the light reflected by the white barrier member 1130 from reentering the light emitting diode chip 1110. That is, it is desirable that the wavelength conversion member 1120 on the long side surface of the light emitting diode chip 1110 have a large thickness.

When the plural light emitting devices 1100 are disposed linearly such that the sides surfaces of the light emitting devices through which the wavelength conversion member 1120 is exposed face each other, dark spots can be generated between adjacent light emitting devices 1100 due to an insufficient quantity of light reaching a region between the adjacent light emitting devices. Accordingly, in order to dispose the light emitting diode chips 1110 of the adjacent light emitting devices 1100 to be close to each other so as to prevent generation of dark spots, the wavelength conversion member 1120 on the short side surfaces of the light emitting diode chip 1110 has a smaller thickness.

Figure 19:
FIG. 19 to FIG. 30 are views illustrating a process of manufacturing a light emitting device according to embodiments of the present disclosure.

FIG. 19 to FIG. 30 are views illustrating a process of manufacturing a light emitting device according to an embodiment of the present invention. Referring to FIG. 19, a first bonding film 20 is stacked on a support substrate 10. The first bonding film 20 secures light emitting diode chips on the support substrate 10 to prevent movement of the light emitting diode chips during the manufacturing process. For example, the first bonding film 20 may be a heat peelable bonding film which exhibit reduction in bonding strength upon application of heat thereto.

Figure 20:
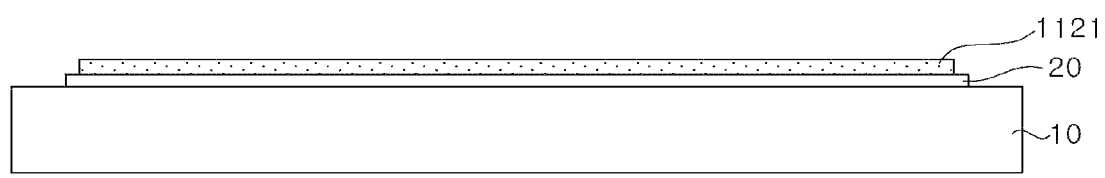

Referring to FIG. 20, a first light transmitting member 1121 is formed on the first bonding film 20. The first light transmitting member 1121 may be deposited on the first bonding film 20 by screen printing. After the first light transmitting member 1121 is deposited on the first bonding film 20, the first light transmitting member 1121 may be subjected to polishing to form a flat upper surface. For example, the first light transmitting member 1121 may be subjected to polishing by a fly cutting method.

For example, the first light transmitting member 1121 may be formed of a transparent silicone. Alternatively, the first light transmitting member 1121 may be formed of a mixture of a transparent silicone and a wavelength conversion material. By way of example, the wavelength conversion material may be phosphors.

Figure 21:
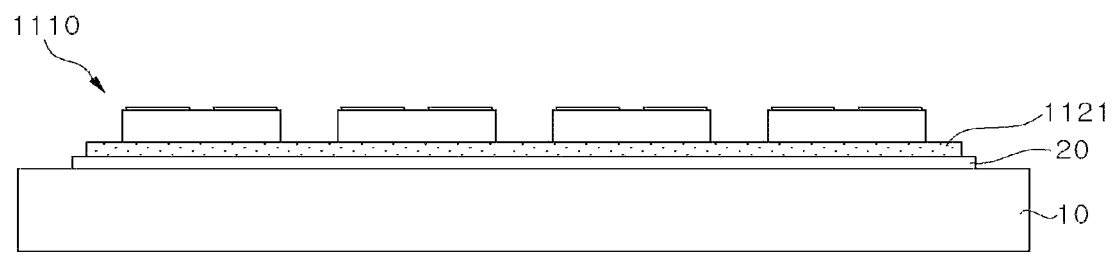

Referring to FIG. 21, a plurality of light emitting diode chips 1110 is disposed on the first light transmitting member 1121. The light emitting diode chips 1110 are disposed thereon such that a first bump pad 1115 and a second bump pad 1116 of each of the light emitting diode chips face upward and upper surfaces thereof contact the first light transmitting member 1121.

Figure 22:
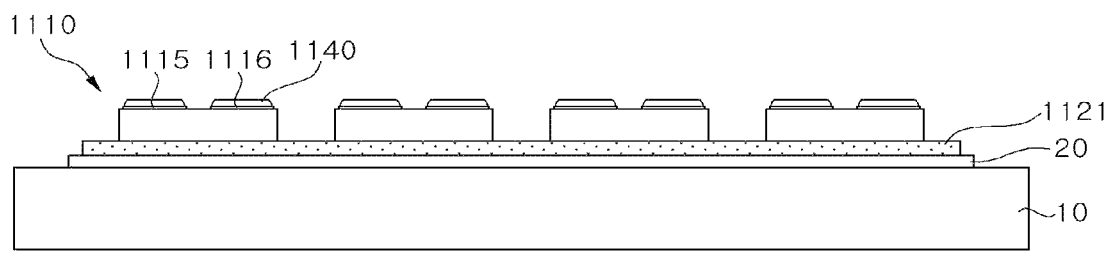

Referring to FIG. 22, an electrically conductive bonding member 1140 is formed on the first bump pad 1115 and the second bump pad 1116 of the light emitting diode chip 1110. For example, the electrically conductive bonding member 1140 may be formed on the first bump pad 1115 and the second bump pad 1116 by screen printing solders thereon.

Figure 23:
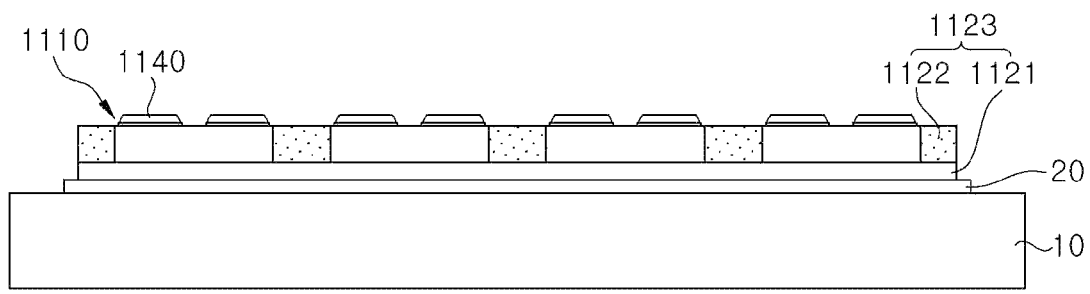

Referring to FIG. 23, a second light transmitting member 1122 is formed. The second light transmitting member 1122 is formed on the first light transmitting member 1121 to cover side surfaces of the light emitting diode chips 1110. Here, the second light transmitting member 1122 is deposited thereon such that a gap between adjacent light emitting diode chips 1110 is filled therewith. The second light transmitting member 1122 is deposited so as not to cover side surfaces of the electrically conductive bonding member 1140. For example, the second light transmitting member 1122 may be formed using a dispenser capable of ejecting a predetermined amount of a resin. The second light transmitting member 1122 may be formed of the same material as the first light transmitting member 1121. When the first light transmitting member 1121 is formed of the same material as the second light transmitting member 1122, the first light transmitting member 1121 and the second light transmitting member 1122 may constitute a single light transmitting member 1123. If the light transmitting member 1123 contains a wavelength conversion material dispersed therein, the light transmitting member 1123 corresponds to the wavelength conversion member 1120 (see FIG. 15 to FIG. 18) of the light emitting device 1100 (see FIG. 15 to FIG. 18) according to the third embodiment.

Figure 24:
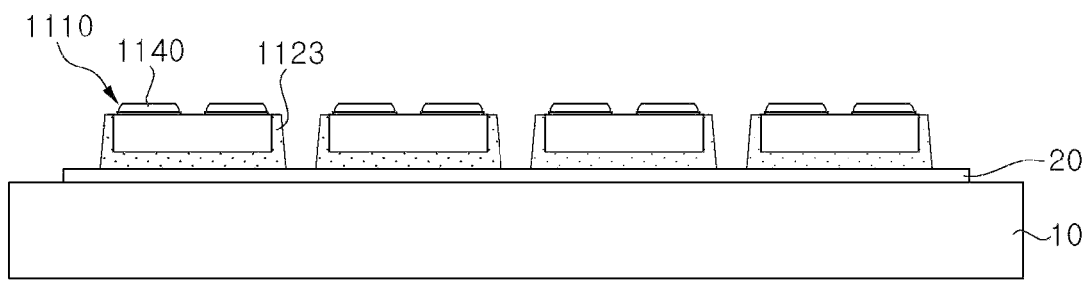

Referring to FIG. 24, the light transmitting member 1123 is subjected to patterning. The light transmitting member 1123 is cut to have inclined side surfaces. For example, the light transmitting member 1123 has a thickness gradually increasing from an upper portion thereof in a downward direction. That is, the light transmitting member 1123 has a thickness gradually decreasing from an upper surface of the light emitting diode chip 1110 to a lower surface thereof.

Figure 25:
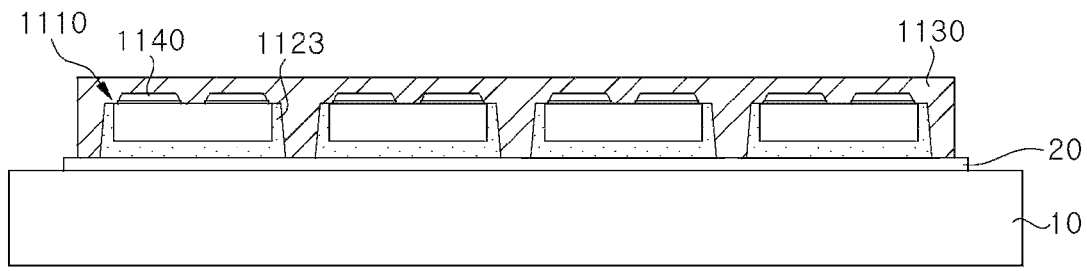

Referring to FIG. 25, a white barrier member 1130 is formed on the first bonding film 20 to cover the light transmitting members 1123, the light emitting diode chips 1110, and the electrically conductive bonding members 1140. For example, the white barrier member 1130 may be formed by depositing an epoxy resin or a silicone resin through screen printing.

According to this embodiment, the white barrier member 1130 is deposited to cover the light emitting diode chips 1110 and the electrically conductive bonding members 1140 exposed through the light transmitting member 1123 while filling a gap between the first bump pad 1115 and the second bump pad 1116 of each of the light emitting diode chips 1110. Accordingly, the method of manufacturing a light emitting device according to this embodiment may omit an underfill process in which the gap between the first bump pad 1115 and the second bump pad 1116 of each of the light emitting diode chips 1110 is filled.

Figure 26:
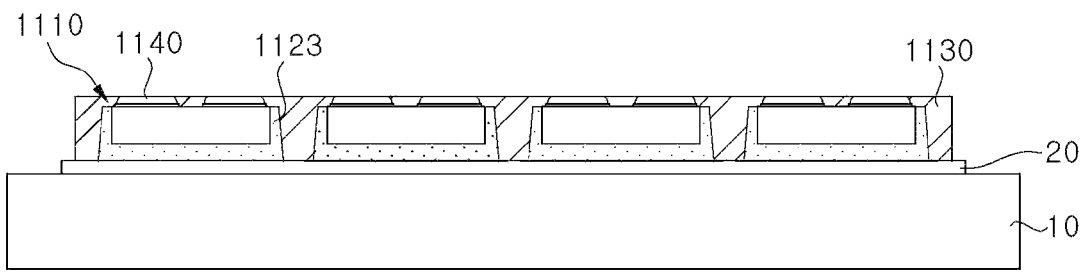

Referring to FIG. 26, an upper surface of the white barrier member 1130 is subjected to polishing. For example, the white barrier member 1130 is subjected to polishing by a fly cutting method until the electrically conductive bonding member 1140 is exposed to the outside.

Figure 27:
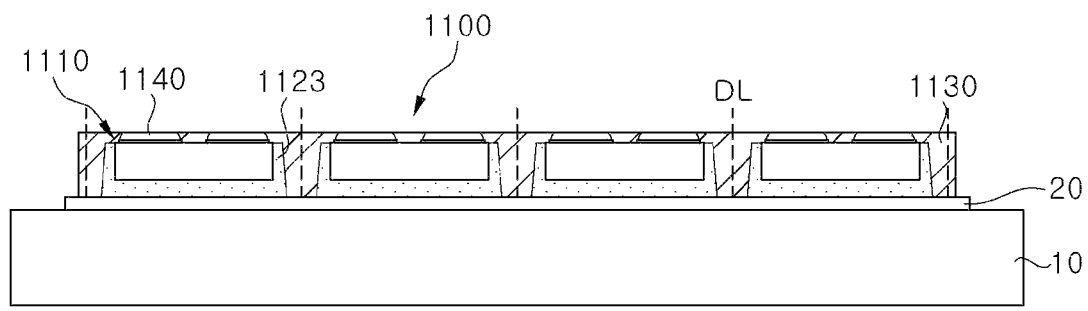

Referring to FIG. 27, the white barrier member 1130 between adjacent light emitting diode chips 1110 is cut by a dicing process. In this embodiment, the dicing process is performed along a dicing line DL shown in FIG. 27. The light emitting diode chips 1110, the light transmitting member 1123 and the white barrier member 1130 are divided into individual light emitting devices 1100 by the dicing process. In addition, the white barrier member 1130 of each of the light emitting devices 1100 may be formed with a mark, which indicates an electrode direction of each of the light emitting diode chips 1110, by a laser beam.

Figure 28:
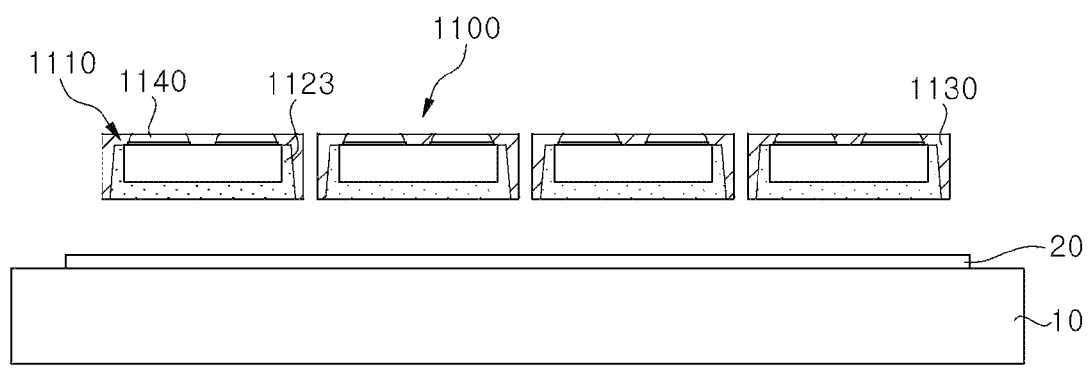

Referring to FIG. 28, the individually divided light emitting devices 1100 are separated from the first bonding film 20. If the first bonding film 20 is a heat peelable bonding film, the plurality of light emitting devices 1100 may be separated from the first bonding film 20 through reduction in bonding strength by applying heat to the first bonding film 20.

Figure 29:
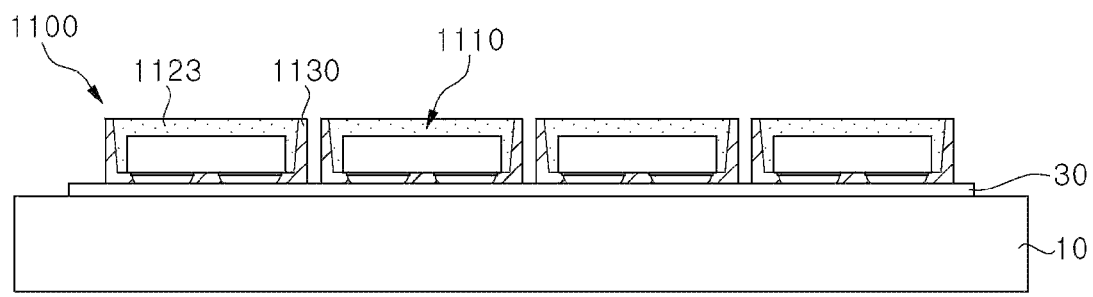

Referring to FIG. 29, the light emitting devices 1100 separated from each other are disposed on a second bonding film 30 formed on the support substrate 10. Here, the light emitting devices 1100 are disposed such that upper surfaces of the light emitting devices 1100 face upwards. Accordingly, the lower surface of the white barrier member 1130 of each of the light emitting devices 1100 is bonded to the second bonding film 30.

Figure 30:
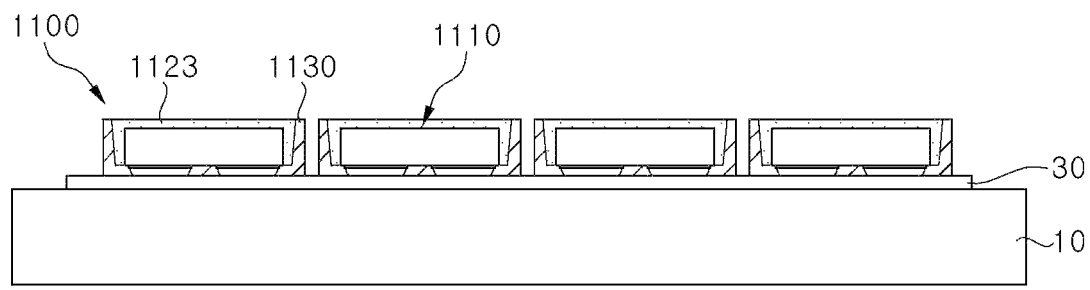

Referring to FIG. 30, the light emitting devices 1100 are subjected to polishing to have flat upper surfaces. For example, the upper surfaces of the light emitting devices 1100 may be subjected to polishing by fly cutting. Then, the second bonding film 30 may be removed. In addition, the individually separated light emitting devices 1100 may be transferred to another bonding film for a subsequent process.

Figure 31:
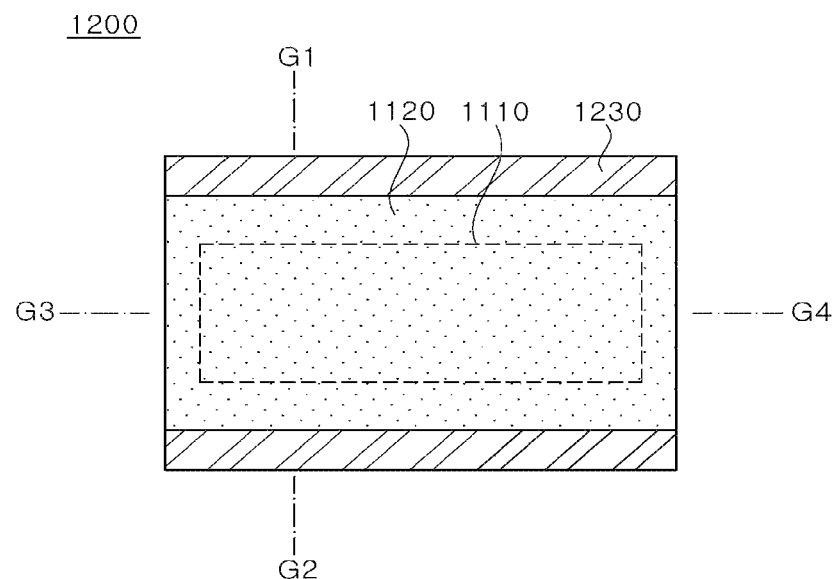
FIG. 31 to FIG. 33 are views of a light emitting device according to a fourth embodiment of the present disclosure.
Figure 32:
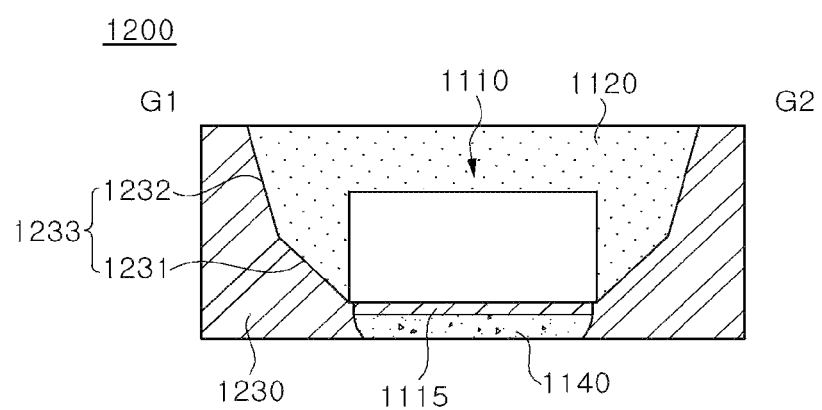
Figure 33:
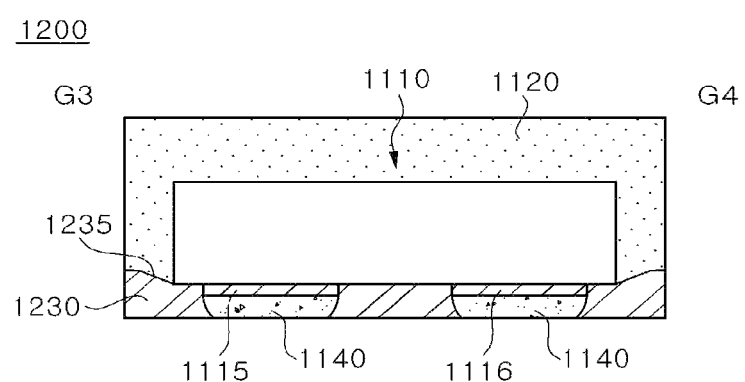

FIG. 31 to FIG. 33 are views of a light emitting device according to a fourth embodiment of the present disclosure. FIG. 31 is a plan view of the light emitting device 1200 according to the fourth embodiment. FIG. 32 and FIG. 33 are cross-sectional views of the light emitting device 1200 according to the fourth embodiment. The light emitting device 1200 according to the fourth embodiment includes a light emitting diode chip 1110, a wavelength conversion member 1120, and a white barrier member 1230.

The light emitting diode chip 1110 and the wavelength conversion member 1120 of the light emitting device 1200 according to the fourth embodiment are the same as those of the above embodiments described above. Thus, detailed description of the light emitting diode chip 1110 and the wavelength conversion member 1120 will be omitted.

Referring to FIG. 32, according to this embodiment, an inner wall 1233 of a white barrier member 1230 disposed on long side surfaces of the light emitting device 1200 includes a first inner wall 1231 and a second inner wall 1232.

The first inner wall 1231 of the white barrier member 1230 adjoins a lower portion of the light emitting diode chip 1110 or a bottom surface of the white barrier member 1230 and the second inner wall 1232 is connected to the first inner wall 1231 and extends to the upper surface of the white barrier member 1230. According to this embodiment, the first inner wall 1231 and the second inner wall 1232 of the white barrier member 1230 have different inclinations.

The first inner wall 1231 of the white barrier member 1230 is inclined to have a greater inclination angle than the second inner wall 1232 with reference to the side surface of the light emitting diode chip 1110. The first inner wall 1231 reflects most light emitted from a lower portion of the side surfaces of the light emitting diode chip 1110. Since the first inner wall 1231 is inclined at a large inclination angle with reference to the side surface of the light emitting diode chip 1110, the first inner wall 1231 can reflect light toward the upper surface of the light emitting device 1200. That is, the light emitting device 1200 according to this embodiment can prevent the light reflected by the first inner wall 1231 from reentering the light emitting diode chip 1110. Accordingly, the light emitting device 1200 has improvement in luminous efficacy by the first inner wall 1231 of the white barrier member 1230.

Despite having a smaller inclination angle, the second inner wall 1232 of the white barrier member 1230 is disposed above the first inner wall 1231 and reflects most light toward the upper surface of the light emitting device 1200.

If the inner wall of the white barrier member 1230 is composed only of the first inner wall 1231, the width of the light emitting device 1200 increases in order to allow the wavelength conversion member 1120 disposed on the light emitting diode chip 1110 to have a sufficient thickness. Thus, in the light emitting device 1200, the second inner wall 1232 disposed above the first inner wall 1231 of the white barrier member 1230 is formed to have a smaller inclination than the first inner wall 1231 in order to prevent increase in size of the light emitting device 1200.

Referring to FIG. 33, a bottom surface 1235 of the white barrier member 1230 disposed between the opposite short side surfaces of the light emitting device 1200 and the opposite side surfaces of the light emitting diode chip 1110 has an inclination. Accordingly, the bottom surface 1235 of the white barrier member 1230 has a height gradually increasing toward the opposite side surfaces of the light emitting device 1200.

Accordingly, light emitted from the light emitting diode chip 1110 and traveling in the downward direction is reflected by the inclined bottom surface 1235 of the white barrier member 1230 toward the upper surface of the light emitting device 1200 or toward an upper portion of the side surfaces of the light emitting device 1200. The light emitting device 1200 may have improvement in luminous efficacy while maintaining a small size by the white barrier member 1230 according to this embodiment.

Figure 34:
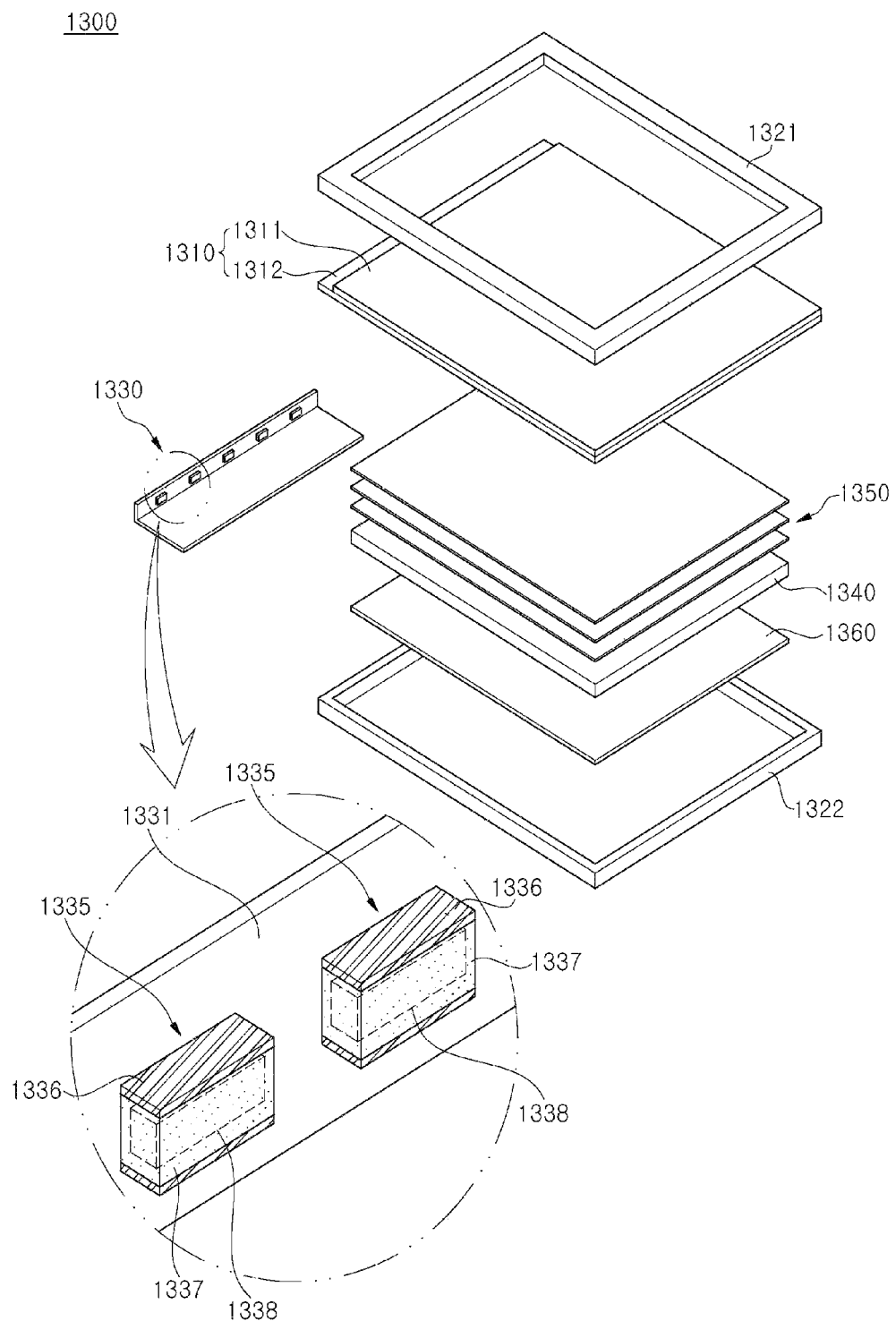
FIG. 34 and FIG. 35 are views of a display device according to embodiments of the present disclosure.
Figure 35:
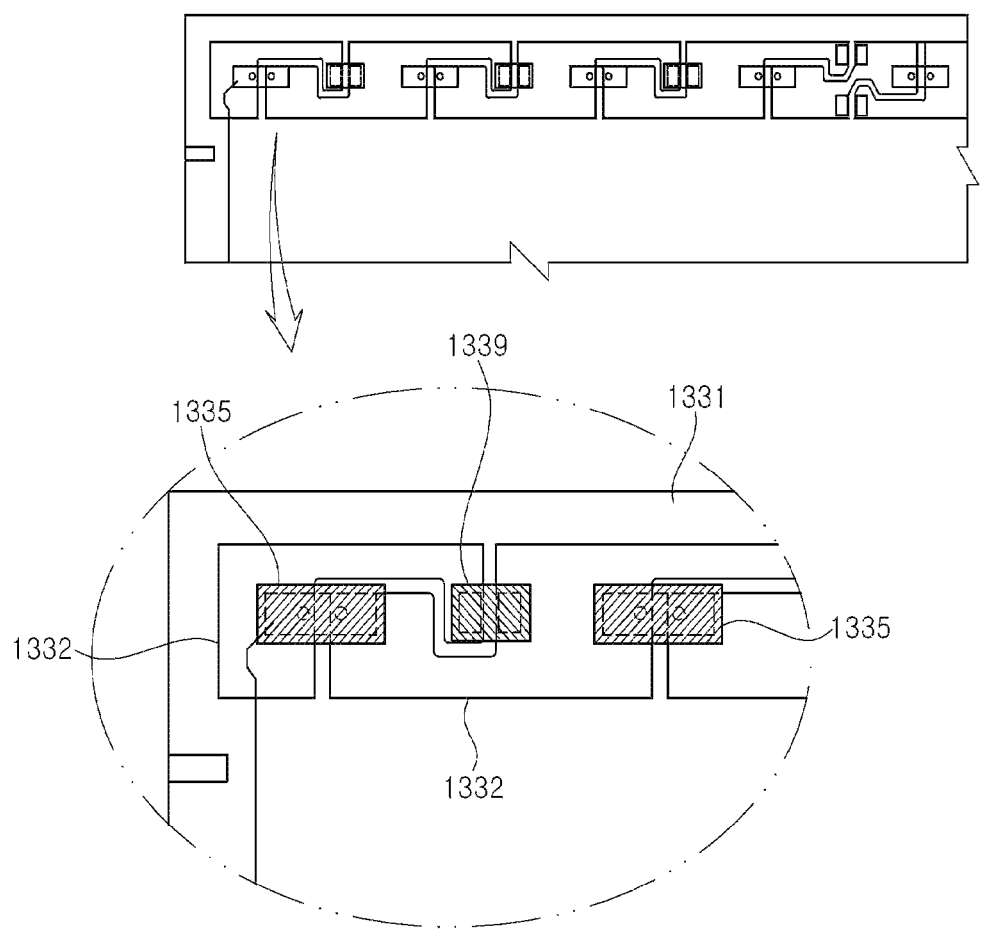

FIG. 34 and FIG. 35 are views of a display device according to an embodiment of the present invention. The display device 1300 according to this embodiment includes a display panel 1310 on which an image is displayed, a backlight unit, a first frame 1321, and a second frame 1322.

The first frame 1321 and the second frame 1322 are coupled to each other to form a space adapted to receive the display panel 1310 and the backlight unit.

The display panel 1310 includes a color filter substrate 1311 and a thin film transistor substrate 1312 facing each other and coupled to maintain a uniform cell gap. The display panel 1310 may further include a liquid crystal layer interposed between the color filter substrate 1311 and the thin film transistor substrate 1312 depending upon the kind thereof.

The backlight unit serves to supply light to the display panel 1310 and includes a light emitting module 1330, a light guide plate 1340, an optical sheet 1350, and a reflective sheet 1360. The light emitting module 1330 includes a circuit board 1331 and a plurality of light emitting devices 1335.

The circuit board 1331 is formed with an electrical circuit pattern 1332 that electrically connects a plurality of light emitting devices 1335 to each other. FIG. 35 shows one example of the circuit board 1331 including the electrical circuit pattern 1332 thereon. As shown in FIG. 35, when the light emitting devices 1335 are disposed on the circuit pattern 1332 of the circuit board 1331, adjacent light emitting devices 1335 are electrically connected in series to each other by the circuit pattern 1332. If the circuit board 1331 is further provided with a Zener device 1339, the Zener device 1339 may be connected in parallel to each of the light emitting devices 1335 by the circuit pattern 1332.

The circuit board 1331 is disposed such that a light exit surface of each of the light emitting devices 1335 faces a side surface of the light guide plate 1340. That is, the backlight unit according to this embodiment is an edge type backlight unit.

The plural light emitting devices 1335 are arrange at constant intervals on the circuit board 1331. Here, the light emitting devices 1335 are the light emitting devices according to various embodiments of the present disclosure described above.

Since the opposite long sides of the light emitting devices 1335 are covered by a white barrier member 1336, the beam angle of light emitted through the upper surface of the light emitting device 1335 can be narrowed. Thus, the backlight unit according to this embodiment is adapted to allow all fractions of light emitted through the upper surfaces of the light emitting devices 1335 to travel toward the side surface of the light guide plate 1340 corresponding to a light entrance surface thereof, thereby improving luminous efficacy.

Further, a wavelength conversion member 1337 is exposed through the opposite short side surfaces of each of the light emitting devices 1335. That is, light is emitted through the opposite short side surfaces of the light emitting devices 1335. Further, the wavelength conversion member 1337 exposed through the opposite short side surfaces of each of the light emitting devices 1335 has a small thickness.

According to this embodiment, the plural light emitting devices 1335 are linearly arranged such that the side surfaces of the light emitting devices 1335 having the wavelength conversion member 1337 exposed thereon face each other. Here, light is emitted from the side surfaces of the plural light emitting devices 1335 and reaches a region between adjacent light emitting devices 1335. However, if the separation distance between the light emitting diode chips disposed inside the light emitting devices 1335 is large, light may not reach the region between the light emitting devices 1335.

According to this embodiment, since the adjacent light emitting devices 1335 are disposed such that the side surfaces of the light emitting devices 1335 having the wavelength conversion member 1337 formed to a small thickness thereon face each other, it is possible to reduce the separation distance between the adjacent light emitting diode chips 1338. Accordingly, the backlight unit according to this embodiment allows the entirety of the region between the plural light emitting devices 1335 to be sufficiently irradiated with light. As a result, the backlight unit according to this embodiment can prevent generation of dark sports on the light guide plate 1340 or the display panel 1310, which receives light emitted from the light guide plate 1340, due to an insufficient quantity of light in some regions thereof.

The light guide plate 1340 converts spot light emitted from the light emitting devices 1335 into sheet light. The optical sheet 1350 is disposed above the light guide plate 1340 to spread and collect light emitted from the light guide plate 1340.

The reflective sheet 1360 is disposed under the light guide plate 1340 to reflect light emitted in the downward direction from the light guide plate 1340 toward the light guide plate 1340.

Although some embodiments have been described herein with reference to the accompanying drawings, it should be understood that these embodiments are provided for illustration only and are not to be construed in any way as limiting the present disclosure. Therefore, it should be understood that the scope of the present disclosure should be defined by the appended claims and equivalents thereto.

I claim:

1. A light emitting device comprising:
a light emitter including a first light emitter and a second light emitter, each of the first light emitter and the second light emitter comprising a first conductivity type semiconductor layer, a second conductivity type semiconductor layer, and an active layer formed between the first conductivity type semiconductor layer and the second conductivity type semiconductor layer;
a first conductor disposed on the first light emitter and electrically connected to the first conductivity type semiconductor layer;
a second conductor disposed on the first light emitter and spaced apart from the first conductor and electrically connected to the second conductivity type semiconductor layer;
a third conductor disposed on the second light emitter and electrically connected to the first conductivity type semiconductor layer;
a fourth conductor disposed on the second light emitter to be spaced apart from the third conductor and electrically connected to the second conductivity type semiconductor layer;
a light transmitter disposed to cover the light emitter and having a first side surface and a second side surface having a length greater than that of the first side surface; and
a white barrier covering the first side surface and the second side surface of the light transmitter,
wherein the first conductor in the first light emitter face the third conductor in the second light emitter along the second side surface and the second conductor in the first light emitter face the fourth conductor in the second light emitter along the second side surface; and
wherein the first conductor and the second conductor are arranged along the first side surface and in parallel to the white barrier.

2. The light emitting device of claim 1, wherein the first light emitter and the second light emitter are electrically connected in series to each other.

3. The light emitting device of claim 1, further comprising: a wavelength converter surrounding the light emitter and configured to receive light emitted from the light emitter to change a wavelength of a received light.

4. The light emitting device of claim 3, wherein the white barrier is disposed to cover long side surfaces of the wavelength converter and expose a surface of the light emitter.

5. The light emitting device of claim 1, wherein the first conductor and the second conductor are disposed to protrude from a surface of the light emitter.

6. The light emitting device of claim 1, wherein the white barrier has an inclined side surface.

7. The light emitting device of claim 1, wherein the light transmitter includes at least one of a transparent silicone or a wavelength conversion material.

8. A light emitting device comprising:
a substrate having a upper surface and side surfaces;
a light emitter disposed on the substrate and comprising a first conductivity type semiconductor layer, a second conductivity type semiconductor layer, and an active layer formed between the first conductivity type semiconductor layer and the second conductivity type semiconductor layer;
a first bump pad disposed on the light emitter and electrically connected to the first conductivity type semiconductor layer; and
a second bump pad disposed on the light emitter to be spaced apart from the first bump pad and electrically connected to the second conductivity type semiconductor layer;
a light transmitter covering the upper surface and the side surfaces of the substrate and having short side surfaces and long side surfaces; and
a white barrier covering the side surfaces of the light transmitter,
wherein the white barrier has a region disposed along a long side surface of the light transmitter such that at least a portion of the short side surfaces of the light transmitter is exposed; and
wherein the first bump pad and the second bump pad are arranged along a short side surface and in parallel to the white barrier.

9. The light emitting device of claim 8, wherein the white barrier has a first inner wall and a second inner wall that have different inclination angles from each other.

10. The light emitting device of claim 8, wherein the white barrier covers the first bump pad and the second bump pad that are exposed through the light transmitter and is configured to fill a gap between the first bump pad and the second bump pad.

11. The light emitting device of claim 8, wherein the light transmitter has a thickness gradually decreasing from a first surface of the light emitter to a second surface of the light emitter, and wherein the first bump pad and the second bump pad are disposed on the second surface of the light emitter.

12. The light emitting device of claim 8, wherein the light transmitter includes at least one of a transparent silicone or a wavelength conversion material.

13. The light emitting device of claim 8, wherein the first bump pad and the second bump pad protrude from a surface of the light emitter.

14. The light emitting device of claim 8, wherein a portion of a wavelength converter covering a first side of the light emitter has a smaller thickness than a portion of the wavelength converter covering a second side of the light emitter, the second side having a length greater than that of the first side.

15. A light emitting device comprising:
- a substrate having an upper surface and side surfaces;
- a light emitter disposed on the substrate and comprising a first conductivity type semiconductor layer, a second conductivity type semiconductor layer, and an active layer formed between the first conductivity type semiconductor layer and the second conductivity type semiconductor layer;
- a first bump pad disposed on the light emitter and electrically connected to the first conductivity type semiconductor layer; and
- a second bump pad disposed on the light emitter to be spaced apart from the first bump pad and electrically connected to the second conductivity type semiconductor layer;
- a light transmitter covering the light emitter and having four side surfaces; and
- a white barrier including two portions covering the side surfaces of the light transmitter, respectively,
- wherein the light transmitter covers the upper surface and the side surfaces of the substrate,
- the white barrier has an inclined inner wall configured to reflect light emitted from the light emitter,
- the first bump pad and the second bump pad are arranged between the two portions of the white barrier.

16. The light emitting device of claim 15, wherein the inclined inner wall of the white barrier comprises:
- a first inner wall adjoining a bottom surface of the white barrier; and
- a second inner wall adjoining the first inner wall and extending to an upper surface of the white barrier,
- the first inner wall and the second inner wall having different inclination angles from each other.

17. The light emitting device of claim 16, wherein the first inner wall of the white barrier has a greater inclination angle than that of the second inner wall with reference to the side surfaces of the light emitter.

18. The light emitting device of claim 15, wherein the first bump pad and the second bump pad are disposed to protrude from a surface of the light emitter.

19. The light emitting device of claim 15, wherein the light transmitter includes at least one of a transparent silicone or a wavelength conversion material.

20. The light emitting device of claim 15, wherein the light transmitter has a thickness gradually decreasing from a first surface of the light emitter to a second surface of the light emitter, and wherein the first bump pad and the second bump pad are disposed on the second surface of the light emitter.

* * * * *